US007421845B2

(12) United States Patent
Bell

(10) Patent No.: US 7,421,845 B2
(45) Date of Patent: *Sep. 9, 2008

(54) THERMOELECTRICS UTILIZING CONVECTIVE HEAT FLOW

(75) Inventor: Lon E. Bell, Altadena, CA (US)

(73) Assignee: BSST LLC, Irwindale, CA (US)

( * ) Notice: Subject to any disclaimer, the term of this patent is extended or adjusted under 35 U.S.C. 154(b) by 257 days.

This patent is subject to a terminal disclaimer.

(21) Appl. No.: 11/023,294

(22) Filed: Dec. 27, 2004

(65) Prior Publication Data

US 2005/0210883 A1    Sep. 29, 2005

Related U.S. Application Data

(63) Continuation of application No. 10/632,235, filed on Jul. 31, 2003, now Pat. No. 6,948,321, which is a continuation of application No. 09/860,725, filed on May 18, 2001, now Pat. No. 6,672,076.

(60) Provisional application No. 60/267,657, filed on Feb. 9, 2001.

(51) Int. Cl.
*F25B 21/02* (2006.01)

(52) U.S. Cl. ............................................. 62/3.2; 62/3.7

(58) Field of Classification Search .................. 62/3.2, 62/3.3, 3.7; 165/80.4, 104.11; 136/204
See application file for complete search history.

(56) References Cited

U.S. PATENT DOCUMENTS

| 3,006,979 | A | 10/1961 | Rich |
|---|---|---|---|
| 3,607,444 | A | 9/1971 | DeBucs |
| 3,635,037 | A | 1/1972 | Hubert |
| 3,663,307 | A | 5/1972 | Mole |
| 3,681,929 | A | 8/1972 | Schering |
| 3,779,814 | A | 12/1973 | Miles et al. |
| 4,065,936 | A | 1/1978 | Fenton et al. |
| 4,281,516 | A | 8/1981 | Berthet et al. |
| 4,494,380 | A | 1/1985 | Cross |
| 4,730,459 | A | 3/1988 | Schlicklin et al. |
| 4,731,338 | A | 3/1988 | Ralston et al. |

(Continued)

FOREIGN PATENT DOCUMENTS

JP    56-18231    2/1981

(Continued)

OTHER PUBLICATIONS

Co-pending U.S. Appl. No. 10/215,163, filed Aug. 7, 2002, drawings, Filing Receipt, and pending claims.

(Continued)

*Primary Examiner*—Melvin Jones
(74) *Attorney, Agent, or Firm*—Knobbe, Martens, Olson & Bear LLP.

(57) ABSTRACT

An improved efficiency thermoelectric system is disclosed wherein convection is actively facilitated through a thermoelectric array. Thermoelectrics are commonly used for cooling and heating applications. Thermal power is convected through a thermoelectric array toward at least one side of the thermoelectric array, which leads to increased efficiency. Several different configurations are disclosed to provide convective thermal power transport, using a convective medium. In addition, a control system is disclosed which responds to one or more inputs to make adjustments to the thermoelectric system.

16 Claims, 20 Drawing Sheets

U.S. PATENT DOCUMENTS

| | | | |
|---|---|---|---|
| 4,989,626 | A | 2/1991 | Takagi et al. |
| 5,092,129 | A | 3/1992 | Bayes et al. |
| 5,097,829 | A | 3/1992 | Quisenberry |
| 5,228,923 | A | 7/1993 | Hed |
| 5,232,516 | A | 8/1993 | Hed |
| 5,429,680 | A | 7/1995 | Fuschetti |
| 5,584,183 | A | 12/1996 | Wright et al. |
| 5,592,363 | A | 1/1997 | Atarashi et al. |
| 5,605,047 | A | 2/1997 | Park et al. |
| 5,682,748 | A | 11/1997 | DeVilbiss et al. |
| 5,802,856 | A | 9/1998 | Schaper et al. |
| 5,860,472 | A | 1/1999 | Batchelder |
| 5,867,990 | A | 2/1999 | Ghoshal |
| 5,900,071 | A | 5/1999 | Harman |
| 5,921,088 | A | 7/1999 | Imaizumi et al. |
| 5,966,941 | A | 10/1999 | Ghoshal |
| 5,987,890 | A | 11/1999 | Chiu et al. |
| 6,082,445 | A | 7/2000 | Dugan |
| 6,084,172 | A | 7/2000 | Kishi et al. |
| 6,096,966 | A | 8/2000 | Nishimoto et al. |
| 6,319,744 | B1 | 11/2001 | Hoon et al. |
| 6,334,311 | B1 | 1/2002 | Kim et al. |
| 6,346,668 | B1 | 2/2002 | McGrew |
| 6,347,521 | B1 | 2/2002 | Kadotani et al. |
| 6,359,725 | B1 | 3/2002 | Islam |
| 6,401,462 | B1 | 6/2002 | Bielinski |
| 6,446,442 | B1 | 9/2002 | Batchelor et al. |
| 6,477,844 | B2 | 11/2002 | Ohkubo et al. |
| 6,481,213 | B2 | 11/2002 | Carr et al. |
| 6,510,696 | B2 | 1/2003 | Guttman et al. |
| 6,530,231 | B1 | 3/2003 | Nagy et al. |
| 6,539,725 | B2 | 4/2003 | Bell |
| 6,598,405 | B2 * | 7/2003 | Bell .............................. 62/3.3 |
| 6,625,990 | B2 | 9/2003 | Bell |
| 6,637,210 | B2 * | 10/2003 | Bell .............................. 62/3.7 |
| 6,672,076 | B2 | 1/2004 | Bell |
| 6,812,395 | B2 | 11/2004 | Bell |
| 2002/0014261 | A1 | 2/2002 | Caillat et al. |
| 2003/0005706 | A1 | 1/2003 | Bell |
| 2003/0079770 | A1 | 5/2003 | Bell |
| 2004/0020217 | A1 | 2/2004 | Bell |
| 2004/0031514 | A1 | 2/2004 | Bell |
| 2004/0076214 | A1 | 4/2004 | Bell |
| 2004/0261829 | A1 | 12/2004 | Bell |

FOREIGN PATENT DOCUMENTS

| | | |
|---|---|---|
| JP | 4-165234 | 6/1992 |
| JP | 5-219765 | 8/1993 |
| WO | PCT/US02/25233 | 8/2001 |
| WO | PCT/US02/03654 | 2/2002 |
| WO | PCT/US02/03659 | 2/2002 |
| WO | PCT/US02/06285 | 3/2002 |
| WO | PCT/US03/17834 | 6/2003 |
| WO | PCT/US03/24899 | 8/2003 |
| WO | PCT/US2004/026757 | 3/2005 |

OTHER PUBLICATIONS

Co-pending U.S. Appl. No. 10/405,001, filed Mar. 31, 2003, drawings, Filing Receipt, and pending claims.

Buist, R.J., et al., "A New Concept for Improving Thermoelectric Heat Pump Efficiency," Borg-Warner Thermoelectrics Wolf and Algonquin Road.

Buist. R., et al., "Theoretical Analysis of Thermoelectric Cooling Performance Enhancement Via Thermal and Electrical Pulsing," *Journal of Thermoelectricity*, No. 4, 1996.

Miner, A., et al., "Thermo-Electro-Mechanical Refrigeration Based on Transient Thermoelectric Effects," *Applied Physics Letters*, vol. 75, 1999, pp. 1176-1178.

Tada, Shigeru, et al., "A New Concept of Porous Thermoelectric Module Using a Reciprocating Flow for Cooling/Heating System (Numerical Analysis for Heating System)," 16th Int'l. Conf. on Thermoelectrics, 1997.

* cited by examiner

THERMOELECTRICS UTILIZING CONVECTIVE HEAT FLOW

REFERENCE TO PRIOR APPLICATIONS

This application is a continuation of U.S. patent application Ser. No. 10/632,235, filed on Jul. 31, 2003 now U.S. Pat. No. 6,948,321, which is a continuation of U.S. patent application Ser. No. 09/860,725, filed May 18, 2001, issued as U.S. Pat. No. 6,672,076, which is related to, and claims the benefit of the filing date of, U.S. Provisional Patent Application No. 60/267,657, filed Feb. 9, 2001.

BACKGROUND OF THE INVENTION

1. Field of the Invention

The present invention relates to improved thermoelectrics for producing heat and/or cold conditions with greater efficiency.

2. Description of the Related Art

Thermoelectric devices (TEs) utilize the properties of certain materials to develop a thermal gradient across the material in the presence of current flow. Conventional thermoelectric devices utilize P-type and N-type semiconductors as the thermoelectric material within the device. These are physically and electrically configured in such a manner that they provide cooling or heating. Some fundamental equations, theories, studies, test methods and data related to TEs for cooling and heating are described in H. J. Goldsmid, *Electronic Refrigeration*, Pion Ltd., 207 Brondesbury Park, London, NW2 5JN, England (1986). The most common configuration used in thermoelectric devices today is illustrated in FIG. 1. Generally, P-type and N-type thermoelectric elements 102 are arrayed in a rectangular assembly 100 between two substrates 104. A current, I, passes through both element types. The elements are connected in series via copper shunts 106 soldered to the ends of the elements 102. A DC voltage 108, when applied, creates a temperature gradient across the TE elements. TE's are commonly used to cool liquids, gases and objects. FIG. 2 for flow and FIG. 3 for an article illustrate general diagrams of systems using the TE assembly 100 of FIG. 1.

The basic equations for TE devices in the most common form are as follows:

$$q_c = \alpha I T_c - \frac{1}{2} I^2 R - K \Delta T \qquad (1)$$

$$q_{in} = \alpha I \Delta T + I^2 R \qquad (2)$$

$$q_h = \alpha I T_h + \frac{1}{2} I^2 R - K \Delta T \qquad (3)$$

where $q_c$ is the cooling rate (heat content removal rate from the cold side), $q_{in}$ is the power input to the system, and $q_h$ is the heat output of the system, wherein:

α=Seebeck Coefficient
I=Current Flow
$T_c$=Cold side absolute temperature
$T_h$=Hot side absolute temperature
R=Electrical resistance
K=Thermal conductance Herein α, R and K are assumed constant, or suitably averaged values over the appropriate temperature ranges.

Under steady state conditions the energy in and out balances:

$$q_c + q_{in} = q_h \qquad (4)$$

Further, to analyze performance in the terms used within the refrigeration and heating industries, the following definitions are needed:

$$\beta = \frac{q_c}{q_{in}} = \text{Cooling Coefficient of Performance } (COP) \qquad (5)$$

$$\gamma = \frac{q_h}{q_{in}} = \text{Heating } COP \qquad (6)$$

From (4);

$$\frac{q_c}{q_{in}} + \frac{q_{in}}{q_{in}} = \frac{q_h}{q_{in}} \qquad (7)$$

$$\beta + 1 = \gamma \qquad (8)$$

So β and γ are closely connected, and γ is always greater than β by unity.

If these equations are manipulated appropriately, conditions can be found under which either β or γ are maximum or $q_c$ or $q_h$ are maximum.

If β maximum is designated by $\beta_m$, and the COP for $q_c$ maximum by $\beta_c$, the results are as follows:

$$\beta_m = \frac{T_c}{\Delta T_c} \left( \frac{\sqrt{1 + ZT_m} - \frac{T_h}{T_c}}{\sqrt{1 + ZT_m} + 1} \right) \qquad (9)$$

$$\beta_c = \left( \frac{\frac{1}{2} Z T_c^2 - \Delta T}{Z T_c T_h} \right) \qquad (10)$$

where;

$$Z = \frac{\alpha^2}{RK} = \frac{\alpha^2 \rho}{\lambda} = \text{Figure of Merit} \qquad (11)$$

$$T_m = \frac{T_c + T_h}{2} \qquad (12)$$

$$R = \rho \times \text{length/area} \qquad (13)$$

$$K = \lambda \times \text{area/length} \qquad (14)$$

$$\lambda = \text{Material Thermal Conductivity, and} \qquad (15)$$

$$\rho = \text{Material Electrical Resistivity} \qquad (16)$$

$\beta_m$ and $\beta_c$ depend only on Z, $T_c$ and $T_h$. Thus, Z is named the figure of merit and is basic parameter that characterizes the performance of TE systems. The magnitude of Z governs thermoelectric performance in the geometry of FIG. 1, and in most all other geometries and usages of thermoelectrics today.

For today's materials, thermoelectric devices have certain aerospace and some commercial uses. However, usages are limited, because system efficiencies are too low to compete with those of most refrigeration systems employing freon-like fluids (such as those used in refrigerators, car HVAC systems, building HVAC systems, home air conditioners and the like).

The limitation becomes apparent when the maximum thermoelectric efficiency from Equation 9 is compared with $C_m$, the Carnot cycle efficiency (the theoretical maximum system efficiency for any cooling system);

$$\frac{\beta_m}{C_m} = \frac{\frac{T_c}{\Delta T}\left(\frac{\sqrt{1+ZT_m} - \frac{T_h}{T_c}}{\sqrt{1+ZT_m}+1}\right)}{\frac{T_c}{\Delta T}} = \left(\frac{\sqrt{1+ZT_m} - \frac{T_h}{T_c}}{\sqrt{1+ZT_m}+1}\right) \quad (17)$$

Note, as a check if $Z \to \infty$, $\beta \to C_m$.

Several commercial materials have a $ZT_A$ approaching 1 over some narrow temperature range, but $ZT_A$ is limited to unity in present commercial materials. Typical values of Z as a function of temperature are illustrated in FIG. 4. Some experimental materials exhibit $ZT_A$=2 to 4, but these are not in production. Generally, as better materials may become commercially available, they do not obviate the benefits of the present inventions.

Several configurations for thermoelectric devices are in current use in applications where benefits from other qualities of TEs outweigh their low efficiency. Examples of uses are in automobile seat cooling systems, portable coolers and refrigerators, liquid cooler/heater systems for scientific applications, the cooling of electronics and fiber optic systems and for cooling of infrared sensing system.

All of these commercial devices have in common that the heat transport within the device is completely constrained by the material properties of the TE elements. In sum, in conventional devices, conditions can be represented by the diagram in FIG. 5. FIG. 5 depicts a thermoelectric heat exchanger 500 containing a thermoelectric device 501 sandwiched between a cold side heat exchanger 502 at temperature $T_C$ and a hot side heat exchanger 503 at temperature $T_H$. Fluid, 504 at ambient temperature $T_A$ passes through the heat exchangers 502 and 503. The heat exchangers 502 and 503 are in good thermal contact with the cold side 505 and hot side 506 of the TE 501 respectively. When a DC current from a power source (not shown) of the proper polarity is applied to the TE device 501 and fluid 504 is pumped from right to left through the heat exchangers, the fluid 504 is cooled to $T_C$ and heated to $T_H$. The exiting fluids 507 and 508 are assumed to be at $T_C$ and $T_H$ respectively as are the heat exchangers 502 and 503 and the TE device's surfaces 505 and 506. The temperature difference across the TE is $\Delta T$.

SUMMARY OF THE INVENTION

None of the existing TE assemblies modify the thermal power transport within the TE assembly by the application of outside influences. An improved efficiency thermoelectric device is achieved by generally steady state convective heat transport within the device itself. Overall efficiency may be improved by designing systems wherein the TE elements are permeable to the flow of a heat transport fluid, transport thermal energy to a moving substance, or move the TE material itself to transport thermal energy. It should be noted that the term "heat transport" is used throughout this specification. However, heat transport encompasses thermal energy transfer of both removing heat or adding heat, depending on the application of cooling or heating.

One aspect of the present invention involves a thermoelectric system having a plurality of thermoelectric elements forming a thermoelectric array. The array has at least one first side and at least one second side exhibiting a temperature gradient between them during operation. In accordance with the present invention, at least a portion of the thermoelectric array is configured to facilitate convective heat transfer through the array. To accomplish this, the array is configured to permit flow of at least one convective medium through the at least a portion of the array to provide generally steady-state convective heat transport toward at least one side of at least a portion the thermoelectric array. The thermoelectric system may be used for cooling, heating or both cooling and heating.

In one embodiment, the convective medium flows through at least some of the thermoelectric elements or along the length, between and/or around the thermoelectric elements. In another embodiment, the convective medium flows both along and through the thermoelectric elements. In one preferred embodiment, to permit flow through the thermoelectric elements, the elements may be permeable or hollow. A combination of both permeable and hollow elements may also be used in an array. In one embodiment, the elements are porous to provide the permeability. In another embodiment, the elements are tubular or have a honeycomb structure.

In one embodiment, flow of the convective medium occurs in a single general direction, such as from the first side to the second side or from a point between the first and second sides toward the first side or the second side. In another embodiment, the convective medium flows in at least two general directions, such as from between the first side and the second side toward the first side and toward the second side. All such flows may be generally within or along the length of the thermoelectric elements (including in a spiral) or a combination thereof.

In one particular embodiment, at least some of the thermoelectric elements form concentric tubes with convective medium flow between the concentric tubes. In one embodiment, a first set of concentric tubes forms a thermoelectric element, with each tubular portion made from thermoelectric material of the same conductivity type as the next tubular portion in the set of concentric tubes. In such an embodiment, a second set of concentric tubes is formed of a thermoelectric material of a different conductivity type from the first set. Alternatively, the tubes may concentrically alternate between p-type thermoelectric material and n-type thermoelectric material.

In another embodiment, at least part of the convective medium is thermoelectric material. The convective medium thermoelectric material forms at least some of the thermoelectric elements. In another embodiment, at least part of the convective medium is thermoelectric material, with the convective medium thermoelectric material forming a first portion of at least some of the thermoelectric elements, and a solid thermoelectric material forming a second portion of the same thermoelectric elements. For example, the solid thermoelectric material is tubular or otherwise hollow, and the convective medium thermoelectric material flows through the solid thermoelectric material. The combination forms at least some thermoelectric elements. In one embodiment, the convective medium is a fluid, such as air, a solid or a combination of a fluid and a solid such as a slurry.

In one configuration, a first plurality of the thermoelectric elements are configured for convective heat transport of a first type and a second plurality of the thermoelectric elements are configured for convective heat transport of a second type. For example, the first plurality of thermoelectric elements may be permeable, and the second plurality may be thermoelectric elements made from the convective material moving through the array. An example of a division of elements is the first plurality being thermoelectric elements of a first conductivity type and the second plurality being thermoelectric elements of a second conductivity type. In another embodiment, at least some of the thermoelectric elements do not utilize convection, while others are configured for convection. For example, the thermoelectric elements that do not utilize convection are of a first conductivity type and the thermoelectric elements that utilize convection are of a second conductivity type.

Preferably, at least a portion of the array has at least one heat transfer feature that improves heat transfer between at least some of the convective medium and at least some of the thermoelectric elements. For example, where the thermoelectric elements are tubular or otherwise hollow, the heat transfer feature is inside at least some of the thermoelectric elements. Where the convective medium flows along the outside of the thermoelectric elements, the heat transfer feature is between at least some of the thermoelectric elements. An example of such heat transfer feature is a convective medium flow disturbing feature.

Another aspect of the present invention involves a method of improving efficiency in a thermoelectric system having a plurality of thermoelectric elements forming a thermoelectric array. The thermoelectric array has at least one first side and at least one second side exhibiting a temperature gradient between them during operation of the thermoelectric array. The method involves actively convecting thermal power through at least a portion of the array in a generally steady-state manner. Generally, the step of convecting thermal power involves flowing at least one convective medium through at least a portion of the thermoelectric array. The convective medium may be fluid, solid or a combination of fluid and solid. The method may be used for cooling, for heating or for both cooling and heating applications.

In one advantageous embodiment, the step of flowing involves flowing at least some of the convective medium through at least some of the thermoelectric elements. For example, the thermoelectric elements are constructed to be permeable or porous. The thermoelectric elements may also be hollow, such as having a tubular or honeycomb configuration.

In one embodiment, the step of flowing involves flowing the convective medium generally through the array from the first side to the second side, or generally from between the first side and the second side toward the first side or toward the second side. In another embodiment, the step of flowing involves flowing the convective medium in at least two general directions, such as flowing the convective medium generally from between the first side and the second side toward the first side and toward the second side. The flow may be through at least some of the thermoelectric elements, along at least some of the thermoelectric elements, through some thermoelectric elements and along others, or any combination.

In one embodiment, the thermoelectric material forms at least a portion of the convective medium. In this embodiment, the method further involves the step of forming a first portion of at least some of the thermoelectric elements with the convective material. As a further alternative, the method in this configuration further involves the step of flowing the convective medium thermoelectric material through other thermoelectric material in a hollow form, the combination of the flowing convective medium thermoelectric material and the thermoelectric material in a hollow form forming the at least some thermoelectric elements.

In one embodiment of the method, the step of actively convecting involves convecting heat through a first portion of the array in a first manner and through a second portion of the array in a second manner. For example, the first portion of the array is a plurality of thermoelectric elements of a first conductivity type and the second portion of the array is a plurality are thermoelectric elements of a second conductivity type.

Yet another aspect of the present invention involves a thermoelectric system with a thermoelectric array having a plurality of thermoelectric elements and having at least one first side and at least one second side. The first and second sides exhibit a temperature gradient between them during operation. At least a portion of the thermoelectric array is configured to permit flow of at least one convective medium through the at least a portion of the array to provide generally steady-state convective heat transport toward at least one side of at least a portion the thermoelectric array. According to this aspect of the present invention, the system has at least one control system, with at least one controller, at least one input coupled to the controller, and at least one output coupled to the controller and to the thermoelectric array. The output is advantageously controllable by the controller to modify at least one characteristic of at least a portion of the thermoelectric array. The at least one input may be at least one external sensor, at least one sensor internal to the thermoelectric array, or a user selectable input, such as a switch or a thermostat, or any combination of these. In one embodiment, the controller operates in accordance with at least one algorithm responsive to the at least one input to control the at least one output.

Preferably, the at least one characteristic impacts the convective heat transport, and the adjustment improves efficiency or power output by adjusting the characteristic. For example, the control system varies movement of at least some of the convective medium in response to the input. In another embodiment, the control system adjusts other characteristics, such as the current through at least some of the thermoelectric elements. The adjustment of characteristics other than the convection may be alone or in combination with adjustment of the convection.

These and other aspects are described in more detail below in conjunction with the following figures.

DETAILED DESCRIPTION OF THE PREFERRED EMBODIMENTS

The invention is introduced using examples and particular embodiments for descriptive purposes. A variety of examples are presented to illustrate how various configurations can be employed to achieve the desired improvements. In accordance with the present invention, the particular embodiments are only illustrative and not intended in any way to restrict the inventions presented. In addition, it should be understood that the terms cooling side, heating side, cold side, hot side, cooler side and hotter side and the like do not indicate any particular temperature, but are relative terms. For example, the "hot," "heating" or "hotter" side of a thermoelectric element or array may be at ambient temperature, with the "cold," "cooling" or "cooler" side at a cooler temperature than ambient. Conversely, the "cold," "cooling" or "cooler" side may be at ambient with the "hot," "heating" or "hotter" side at a higher temperature than ambient. Thus, the terms are relative to each other to indicate that one side of the thermoelectric is at a higher or lower temperature than the counter-designated side. Similarly, the terms "cooling side" and "heating side" are not intended to designate the particular use for a thermoelectric system in any given application.

Figure 6:
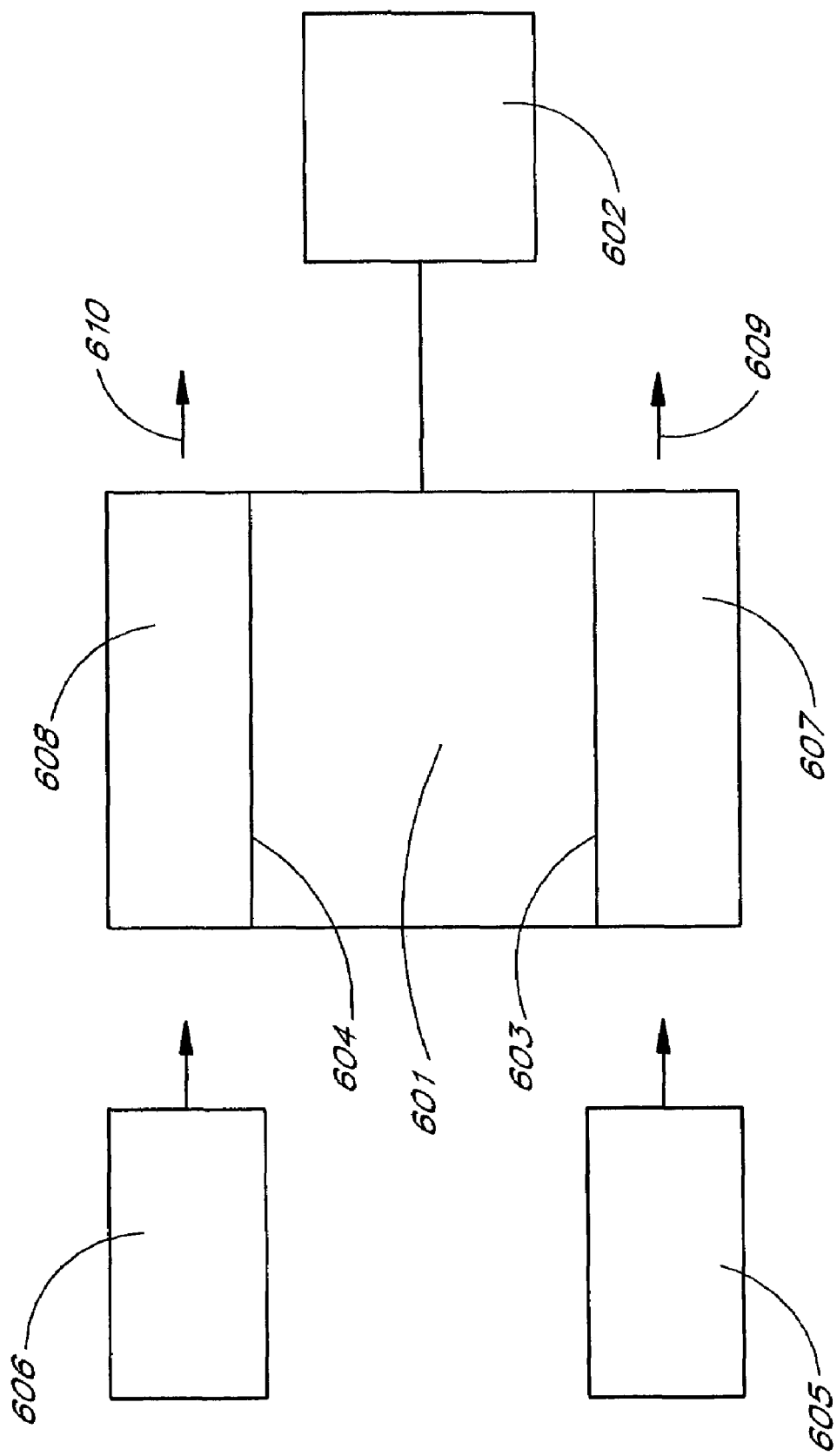
FIG. 6 illustrates a generalized block diagram of a thermoelectric system.

A block diagram of an overall TE system 600 is shown in FIG. 6. A thermoelectric assembly 601 with hot side 603 and cool side 604 is electrically connected to a power source 602. The thermoelectric assembly 601 is in good thermal contact with a hot side heat exchanger 607 on the hot side 603 and with a cool side heat exchanger 608 on the cool side 604. Equipped with suitable ducts or pipes, sources of fluid, 605 for the hot side 603 and 606 for the cool side 604, send their fluids through their respective heat exchangers 607 and 608. Heated fluid 609 and cooled fluid 610 exit the system at the right in FIG. 6. For certain applications (with examples given below) one of the heat exchangers 607 or 608 may be replaced with a heat sink, thereby eliminating the need for a fluid source or fluid on that side.

The present invention is based on the concept that the conductive/loss heat transport terms in Equations 1 and 3 which contain K and R, can be modified by the use of steady state convection through the array so as to diminish their overall effect on system performance. How this can be accomplished can be understood by first looking at the equations that govern heat generation and flow in a conventional TE. For simplicity, assume that material properties do not change with current and temperature, heat and current flow are one-dimensional, and that conditions do not vary with time. For this case:

$$-K\frac{d^2T}{dx^2} = \frac{I^2R}{L} \tag{18}$$

where;

$$I^2R/L = \text{the resistive heat generation per unit length.} \tag{19}$$

For TE systems with typical boundary conditions, Equation 18 has Equations 1 and 3 as solutions. From Equation 3, the heating source term ($\alpha IT_h$) contributes to heat output at the hot side as does $\frac{1}{2}I^2R$, that is, one-half of the TE element resistive heating. Note that the other one half goes out the cold side, as seen in Equation 1 (where it has the minus sign since it subtracts from cooling). Further the heat output at the hot side is reduced by the conductive loss, $K\Delta T$. Thus, Equation 3 shows that $q_h$ is reduced by $K\Delta T$ and $\frac{1}{2}$ of the $I^2R$ heating within the TE elements.

Consider a comparison between conventional thermoelectric heating, and systems that employ steady state convective heat transport. If convection is added and the other assumptions are retained, Equation 18 becomes:

$$-K\frac{d^2T}{dx^2} = -CpM\frac{dT}{dx} + \frac{I^2R}{L} \tag{20}$$

where;

$$CpM = \text{Thermal mass of fluid transported per unit time.} \tag{21}$$

The extra term leads to a new parameter $\delta$, which is the ratio of convective to conductive heat transport. If it is assumed that the convective transport goes toward the hot end in the heating mode and the cold end in cooling, and appropriate boundary conditions are used, the solutions to Equation 20 for cooling and heating become;

$$q_C = \alpha IT_c - \frac{\xi(\delta)}{2}I^2R - K(\delta)\Delta T \tag{21}$$

$$q_h = \alpha IT_h + \frac{\xi(\delta)}{2}I^2R - K(\delta)\Delta T \tag{22}$$

where;

$$\delta = \frac{CpM}{K} \tag{23}$$

$$\xi(\delta) = \left(\frac{2}{\delta}\right)\frac{(\delta + e^{-\delta} - 1)}{(1 - e^{-\delta})} \tag{24}$$

$$K(\delta) = K\left(\frac{\delta e^{-\delta}}{1 - e^{-\delta}}\right) \tag{25}$$

Notice that $K(\delta)$ is a function of $\delta$ and approaches the conductive value K for $\delta \to 0$. Also, for $\delta > 0$ a larger portion of the $I^2R$ heating is transported to the hot (in heating) or cold (in cooling) end. The term $\xi(\delta)/2 \rightarrow \frac{1}{2}$ when $\delta \rightarrow 0$ as expected. Approximate values for $\xi(\delta)$ and $K(\delta)/K$ are given in Table 1. Note from Equation 2, that $q_{in}$ is not a direct function of $\delta$. Also, a condition is imposed on $\delta$ by the energy balance requirement that $CpM\Delta T$ (the power required to heat or cool the fluid) cannot exceed $q_h$ (the heat generated by the TE) or $q_c$ (the heat absorbed by the TE). Typically, this restricts $\delta$ to less than 5. Actual improvement in COP for allowable values for $\delta$ ranges up to about 100%. Similarly, $q_c$ improves by up to about 50%.

TABLE 1

| $\delta$ | $\xi(\delta)$ | $K(\delta)/K$ |
|---|---|---|
| 0 | 1.000 | 1.000 |
| .1 | 1.017 | .951 |
| .2 | 1.033 | .903 |
| .5 | 1.083 | .771 |
| 1.0 | 1.164 | .582 |
| 2.0 | 1.313 | .313 |
| 5.0 | 1.614 | .034 |

In the heating mode, convection enhances performance in two ways: first, a larger fraction of the heating is transported to the hot end, since $\xi(\delta)>1$ for $\delta>0$, and second, $K(\delta)<K$ for $\delta>0$ so that less thermal power is lost to conduction.

The situation is more complex in cooling. To best understand cooling operation, consider the case where the waste side is a heat sink at ambient temperature. The convective medium enters at the waste side and exits out the cold side. Thus the TE elements extract heat content from the medium thereby cooling it as it moves toward the cold side. The parameter $K(\delta)<K$ for $\delta>0$ as in heating, so the conduction term diminishes with increased $\delta$ as in heating. However this advantage is partially offset by an increase in the fraction of heating transported to the cold end by $I^2R$ heating. Nevertheless, the change in $K(\delta)$ can be greater than $\xi(\delta)$, for increasing $\delta$, so that under most conditions $q_c$ increases with increased convection. The effect can be enhanced further by a decrease of the current I to a minimum optimum value from a higher value. While the thermal cooling decreases proportionally to the reduction in I, the resistive heating term decreases as the square of I and hence more rapidly. such current reduction can be utilized to offset further the increase in the resistive heating term from convection. The net result is that under many important practical operating conditions, cooling efficiency increases. Calculations for specific TE systems are required to determine conditions that exhibit gain when utilizing convective transport.

Figure 7A:
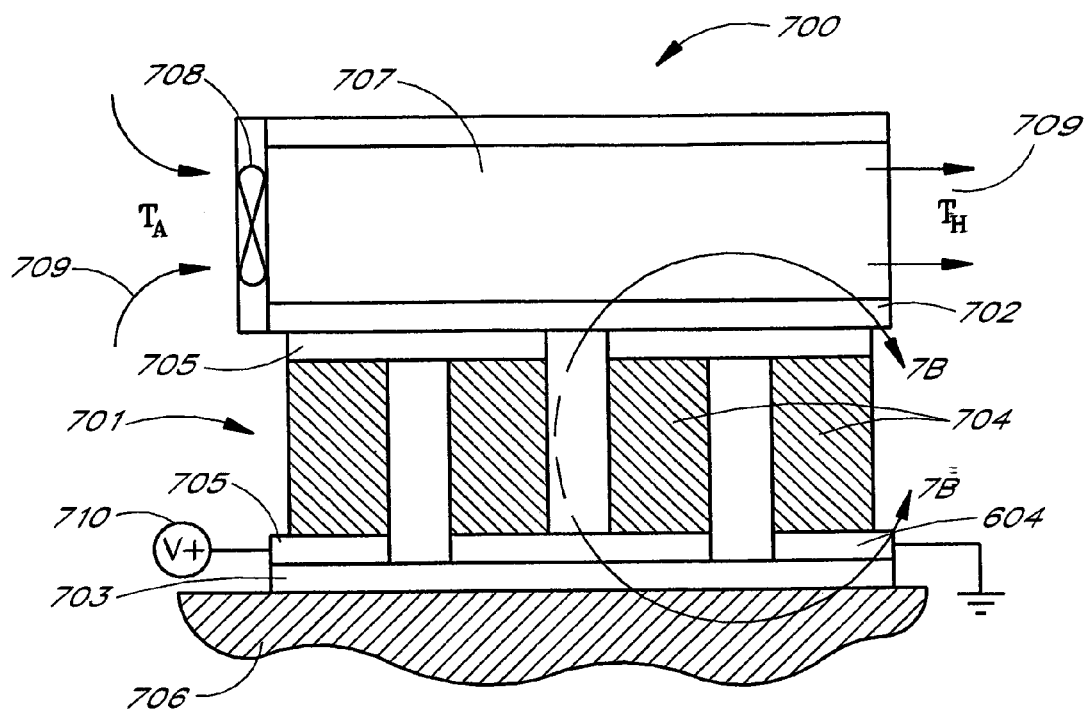
FIGS. 7A and 7B depict an embodiment of a conventional thermoelectric system.

The basic concept of improvement in efficiency by steady state convective heat transport through the array is explained using FIGS. 7 and 8. FIG. 7A depicts a conventional TE system 700 without convective heat transport. A TE element array 701 is constructed with a hot side substrate 702 and a cool side substrate 703 sandwiching a plurality of TE elements 704, electrically connected in series by circuitry 705. A power source 710 is applied across the TE array 701. The TE elements 704 and the circuitry 705 are in good thermal contact with each other and with the hot and cool side substrates 702 and 703. On the cool side, a heat sink 706 is in good thermal contact with the cool side substrate 703. From the standpoint of this TE system, the heat sink 706 is effectively infinite. On the hot side, a heat exchanger 707 is in good thermal contact with the hot side substrate 702. In this embodiment, the heat exchanger is a fin assembly. A fan 708 is a source of air 709 for the heat exchanger 707. When operating, electrical power from the power source 710 passes current through the TE elements 704 and through circuitry 705 on the substrates 702 and 703. The TE elements 704 are connected so that the hot side substrate 702 becomes warm and heats the heat exchanger fins 707. The air 709 is pumped through fins (not explicitly shown) of the heat exchanger 707 by the fan 708 entering at the left at ambient temperature $T_A$ and exiting at the right at temperature $T_H$.

Figure 7B:
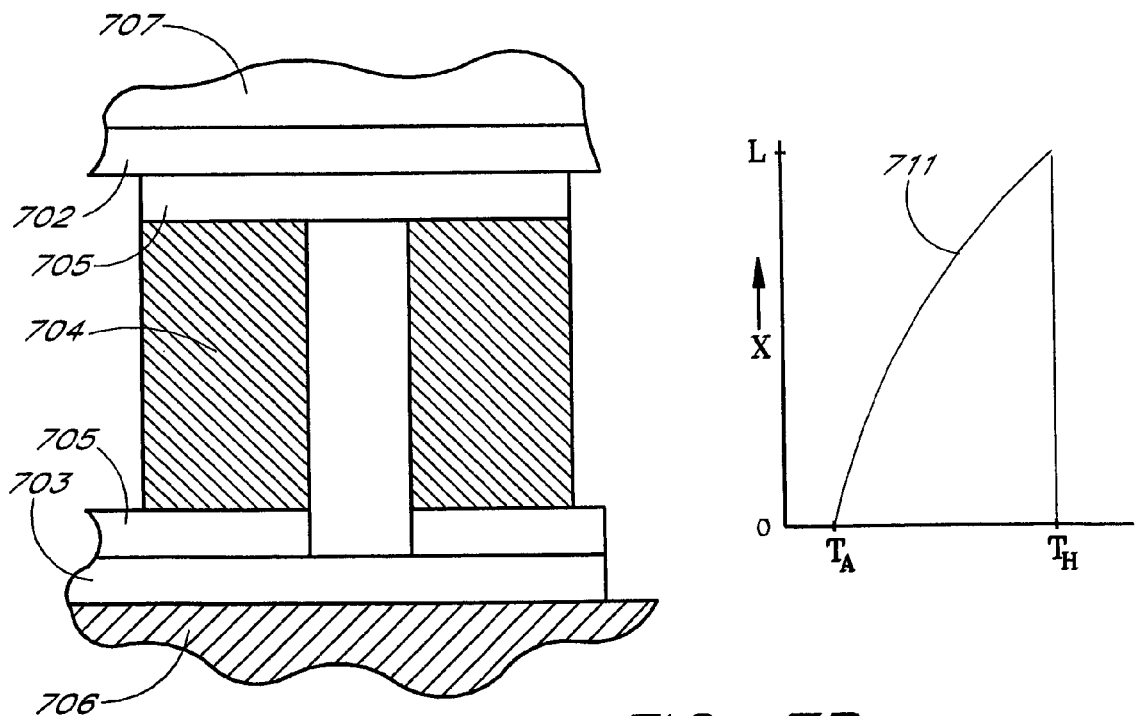

An enlarged view of section B-B of the assembly 701 is depicted in FIG. 7B with a corresponding temperature profile (not to scale), 711 within the TE elements 704. The location x=0 is the interface between the TE elements 704 and circuitry 705 on the cold side substrate 703. Similarly, x=L is interface between the TE elements 704 and circuitry 705 on the hot side substrate 702. The temperature 711 is $T_A$ at x=0 and $T_H$ at x=L.

Figure 8A:
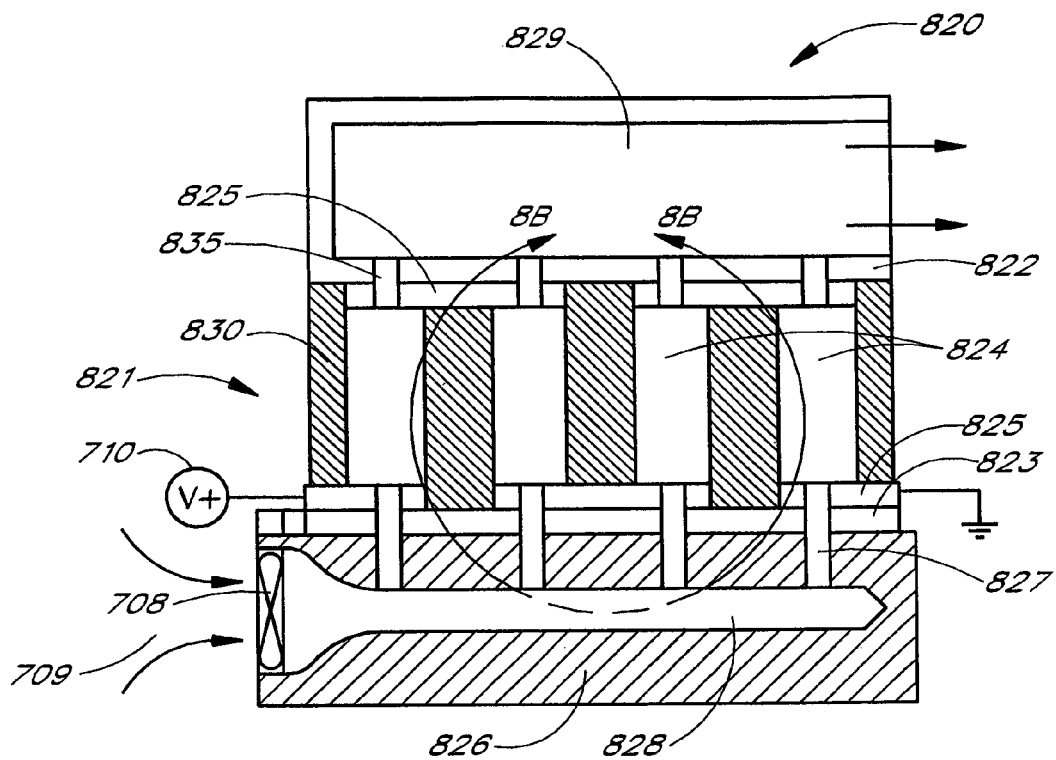
FIGS. 8A and 8B depict an embodiment of a thermoelectric system employing convective heat transport in accordance with the present invention.

FIG. 8A depicts one embodiment of a TE system 820 in accordance with the present invention. This TE system 820 is similar to the TE system 700 but has convective heat transport. The TE system 820 has many parts corresponding to those of the TE system 700 shown in FIG. 7A which are labeled with the same reference numerals.

The TE system 820 has a TE element array 821 that has a permeable or porous thermoelectric elements 824, a manifold 828 within a cold side heat sink 826, holes 827 which extend from the manifold 828 through the cold side substrate 823 and through circuitry 825. Similar holes 835 extend from a heat exchanger manifold 829 through the hot side substrate 822 and the hot side circuitry 825. Preferably, between the TE elements 824 is a thermally and electrically insulating material 830. In the present embodiment, air (or other fluid) 709 is ducted by the manifold 828 through the porous TE element 824. The air 709 is then ducted out through a manifold 829. In the figure, the air 709 enters at the lower left at temperature $T_A$ and exits at the upper right at temperature $T_H$. Preferably, the air flow rate and the porosity of the TE elements are matched so that the air and TE element temperatures are nearly in equilibrium at any position within the active area of the elements. A fan 708 controls the flow. As the air 709 passes through the TE elements 824 it absorbs heat content from the TE elements 824 and carries the heat generated by the TE system 820 through the manifold 829.

Assuming $\alpha$, R and K are the same for TE systems 700 and 820, the movement of the air 709 in FIG. 8 causes three profound changes. First, as the TE elements 824 are heated by the $I^2R$ (resistive heating), a portion of the heat is convected toward the hot side and so a fraction of $I^2R$ heating larger than $\frac{1}{2}I^2R$ will move to the hot side. As a result, more of the $I^2R$ heating will contribute to the $q_h$ term of Equation 3 resulting in more heat transfer to the heated fluid. Second, the conduction loss at x=0 is lower because the slope of the temperature profile is less at x=0. Third, the air exiting the system at x=L carries up to all of the heat content $q_h$. In some cases of interest, the air carries all the heat content, and when it does, efficiency gain is greatest.

Figure 8B:
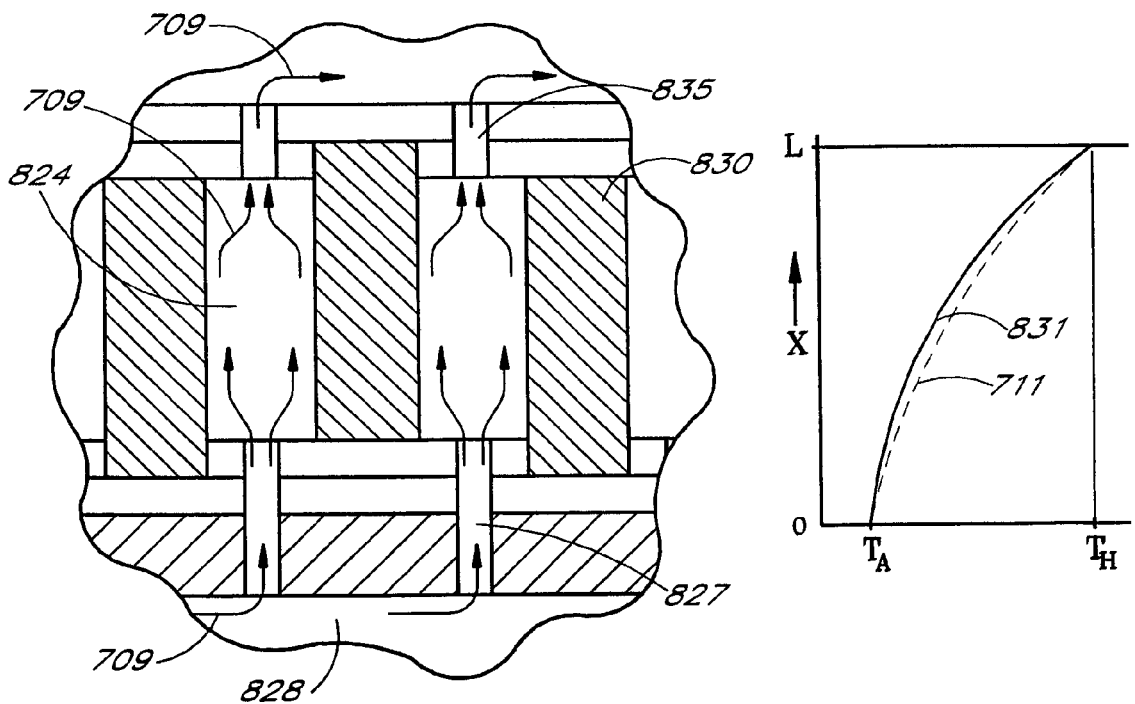

FIG. 8B illustrates an enlargement of a portion along section 8B-8B of the TE array assembly 821 shown alongside the graph of temperature vs. position along the length of a TE element 824 for this configuration. Air flow 709 through the TE elements 824 is depicted. A corresponding temperature profile 831 of both the air 709 and the porous elements 824 (preferably assumed to be near equilibrium or equilibrium at all positions, x) is shown to the right. The temperature profile 831 in the graph in FIG. 8B shows that while the temperature reaches $T_h$ at L, just like the profile 711 for the TE system 700 in FIG. 7B, its shape for TE system 820 has greater curvature with less temperature rise near x=0. Generally, the TE system 820 offers greater efficiency, and hence has lower power consumption and operating costs to achieve a temperature $T_H$ for the same amount of air flow as compared to the system in FIG. 7A.

It should be noted that for the embodiment of FIG. 8, as well as other embodiments herein, although a single hotter side substrate and single cooler side substrate are generally depicted, a TE system in accordance with the present invention may stack TE arrays, or otherwise have multiple colder side substrates and multiple hotter side substrates.

Another embodiment of a TE system 900 that employs convective heat transport in accordance with the present invention is shown in FIG. 9. This embodiment has a TE array 921 made up of TE elements 902, hot and cold side substrates 922, 923, circuitry 925, heat sink 906, heat exchanger 907, pumps 909, and holes 927, 931 through the circuitry and substrates 922, 923. Two heat transfer fluids 911, 912 are thermoelectric materials that constitute the TE elements 902. The two heat transfer fluids, N-type 912 and P-type 911, occupy the space between the cold side substrate 923 and the hot side substrate 922. Heat transfer fluids 911, 912 are also contained within heat exchangers 908 that are connected to two finned tube arrays which are electrically insulated from one another. There are two sets of channels 910 in the cool side heat sink 906.

The heat transfer fluids 911, 912 consist of N- and P-type liquid TE materials. One example of liquid TE materials is a mixture of Thallium and Tellurium (p-type) at temperatures (above room temperature) where it becomes liquid, and a mixture of mercury/rubidium (n-type). Some such materials are described by A. F. Loffe, in Semiconductor Thermal Elements, and Thermoelectric Cooling, Infosearch, London, 1957. Another example is P-type Bismuth Telluride slurried in mercury and N-type Bismuth Telluride slurried in mercury.

Figures 9A, 9B:
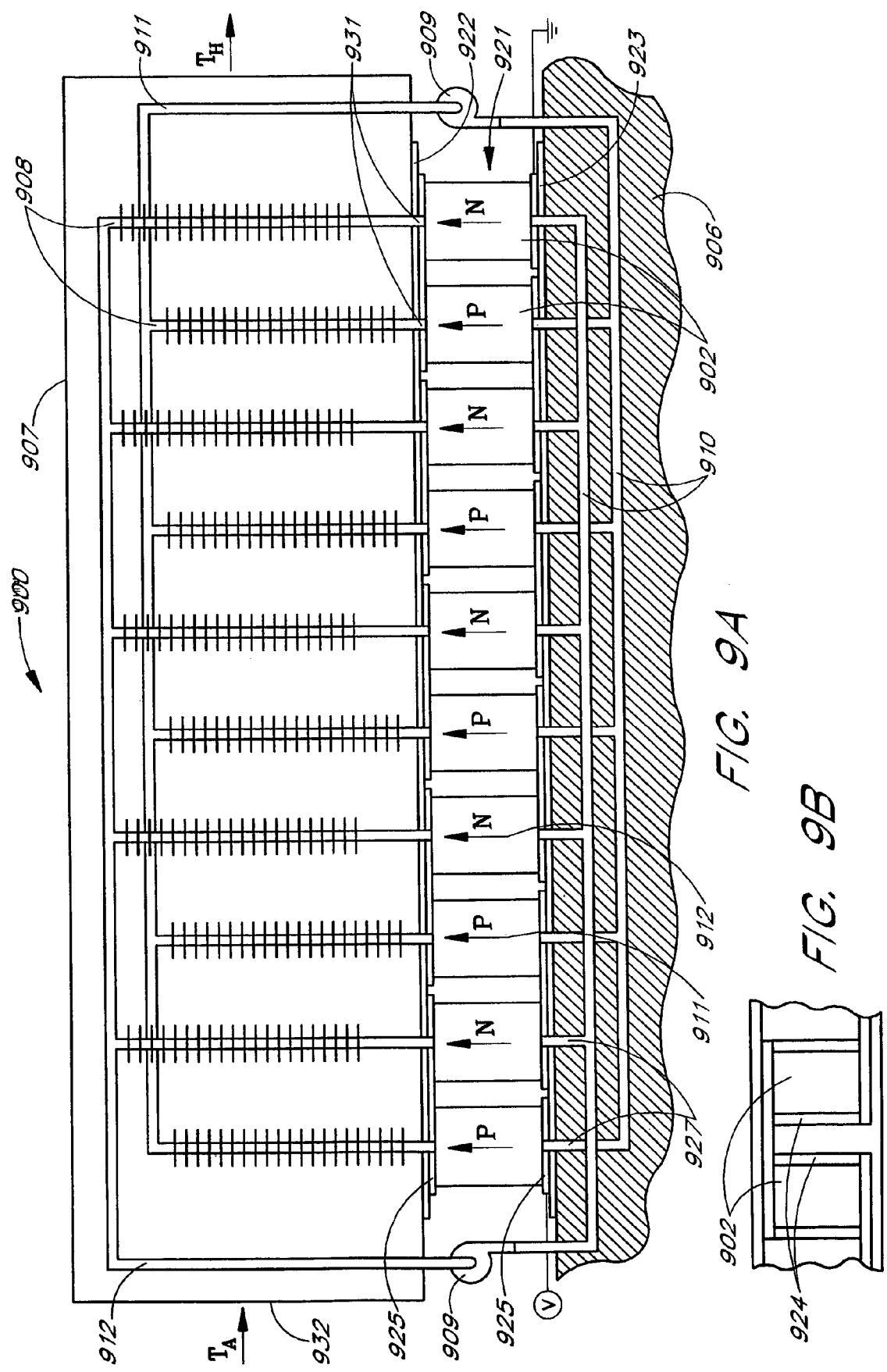
FIGS. 9A and 9B depict another embodiment of a thermoelectric system in accordance with the present invention using a liquid thermoelectric material for convective heat transport.

FIG. 9B illustrates an enlarged view of a portion of the TE array 921. As depicted in FIG. 9B, the heat transfer fluids at the point at which they form TE elements 902 are contained within sleeves 924. Advantageously, the sleeves 924 are electrically insulative and have a thermal conductivity that is low enough such that the sleeves' 824 heat conduction from the hot side 922 to the cold side 923 is substantially negligible compared to $K\Delta T$ where K is the thermal conductance of the TE element 902. In one embodiment, the sleeves 924 are formed of solid thermoelectric material.

The pumps 909 cause the heat transfer fluids to move through the channels 910, forming the thermoelectric elements 902 as they flow between the substrates 922, 923, and to flow through the finned heat tubes 908. In the present embodiment, the flow of the heat transfer fluids 911, 912 convects heat from the cool side heat sink 906 to the hot side heat exchanger 907 under the action of the pumps 909. Within the hot side heat exchanger 907, heat is transferred to air or gas 932 entering at the left at temperature $T_A$, and exiting at the right at temperature $T_H$. The two pumps 909 and two separate finned tubes 908 carry, electrically isolated from one another, the two heat transfer fluids 911, 912. The heat transfer fluids' 911, 912 paths each are constructed to have high electrical resistance between the several connected fluid paths so that the required voltages can be applied across the TE elements 902 and the circuitry 925, without significant parasitic losses.

It should be noted that different portions of the thermoelectric array may be configured with different types of convective heat transfer, or no convective heat transfer. For example, in one embodiment, the heat transfer mechanism of FIGS. 8 and 9 may be combined, using the steady state convection of FIG. 8 for a portion of the array and the steady state convection of FIG. 9 for another portion of the array. In one embodiment, one configuration is used for the n-type thermoelectric elements and another configuration is used for the p-type thermoelectric elements.

FIGS. 10 through 15 depict different embodiments of TE elements that can be used in place of the porous elements described in FIG. 8. Preferably, with these embodiments, the fluid and solid elements are designed to have minimal temperature differences between them and the convective medium at any point within the TE elements.

Figure 10:
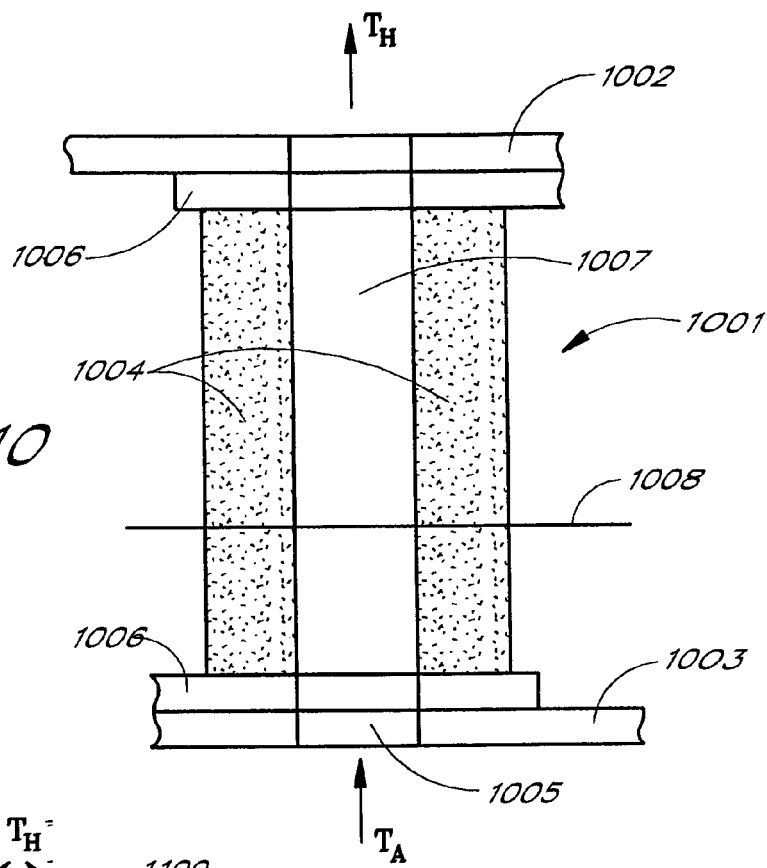
FIG. 10 depicts a detailed illustration of a portion of the TE element array showing a tubular TE element.

FIG. 10 shows a portion 1001 of a TE element array for use in a system such as that shown in FIG. 8 with a hot side substrate 1002, a cold side substrate 1003, circuitry 1006, holes 1005 through the substrates and circuitry, and a plurality of hollow, solid TE elements 1004. The heat transfer liquid (which may be liquid TE material or another non-TE material fluid) enters holes in the cool side at temperature $T_A$ and exits the hot side at temperature $T_H$. The TE element 1004 (not to scale) has a large enough interior surface area compared to the interior hole 1007 diameter and its wall thickness so that there is minimal temperature difference between the element wall and the convective medium in the internal hole 1007 at any selected position along the direction of fluid flow (e.g., as indicated by the line 1008).

Figure 11:
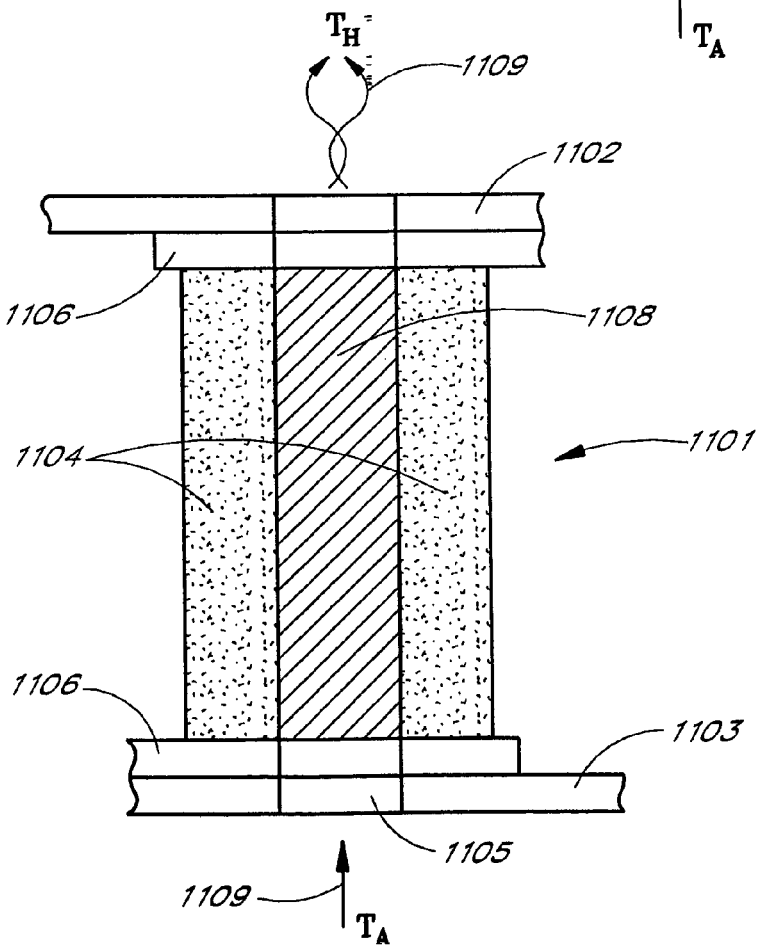
FIG. 11 depicts a detailed illustration of a portion of the TE element array showing a tubular TE element with a heat transfer feature.

FIG. 11 shows a portion 1101 of a thermoelectric array like that of FIG. 10 with a hot side substrate 1102, a cold side substrate 1103, circuitry 1106, holes 1105 through the substrates and circuitry, and a plurality of hollow TE elements 1104. FIG. 11 illustrates a heat transfer feature. One particular example is a flow-disturbing feature to mix the flow, such as spiral vanes 1108 placed inside the hollow (e.g., tubular) TE elements 1104. The vanes serve to spin and mix the heat transfer fluid 1109 thereby increasing the heat transfer from the TE elements 1104 to the heat transfer fluid 1109. Another example of a flow-disturbing feature is grooves, like rifling on a gun, placed on the inside of the hollow TE elements 1104. Any feature that improves heat transfer between the thermoelectric elements and the convective medium as it flows past or through the TE elements, provided that it does not greatly inhibit flow, will suffice.

Figure 12A:
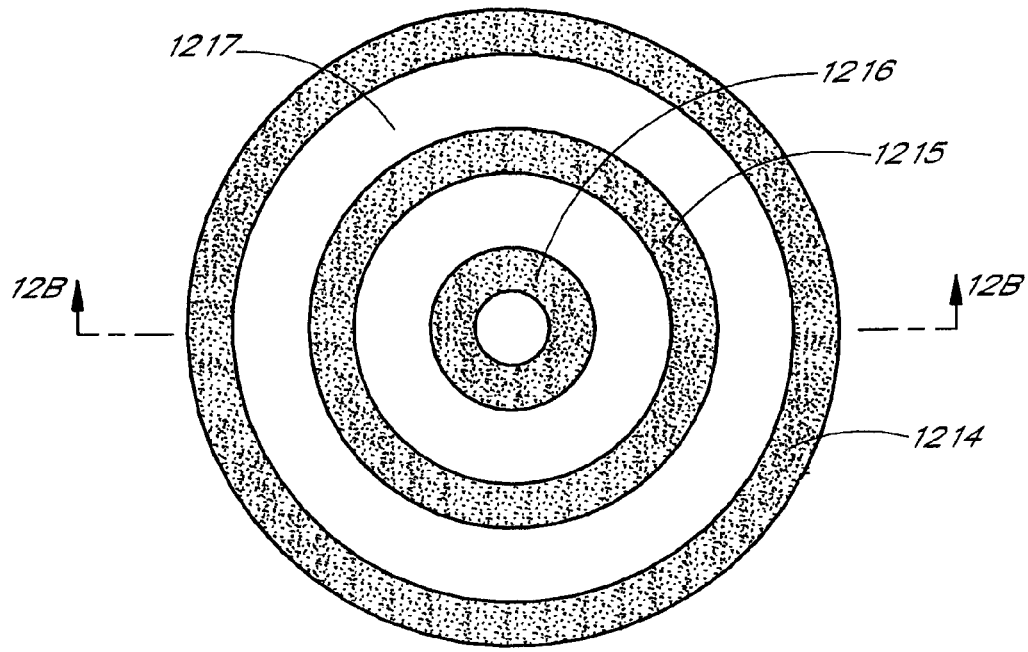
FIGS. 12A and 12B depict a detailed illustration of a portion of the TE element array showing a TE element composed of nested concentric tubes.
Figure 12B:
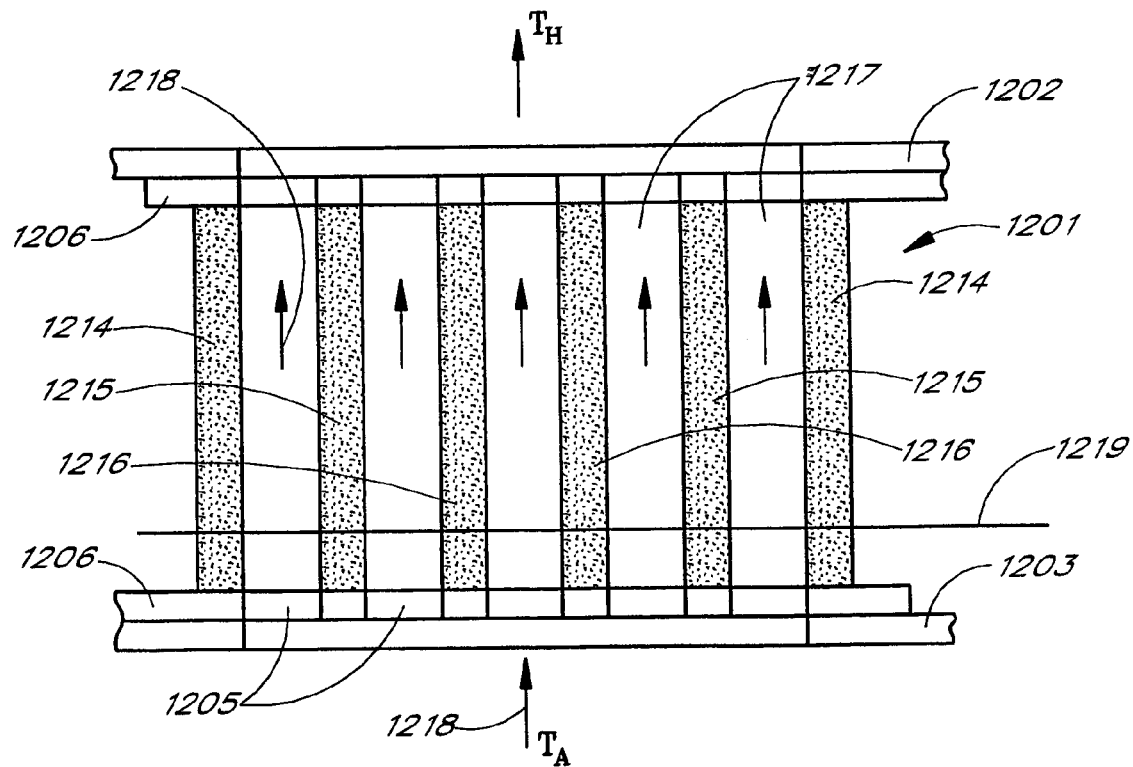

FIGS. 12A and 12B depict a construction of a TE array 1201 in which the TE elements form concentric tubes 1214-1216. FIG. 12A depicts a top view of the thermoelectric elements 1214, 1215 and 1216 only. FIG. 12B shows a cross-section through B-B of FIG. 12A, and adds the substrates 1202, 1203 and circuitry 1206 along with fluid flow from bottom to top. The TE array 1201 has hot and cool side substrates 1202 and 1203, circuitry 1206, and the concentric tubes 1214, 1215, and 1216. The holes in the circuitry and substrate 1205 are aligned with the annular gaps 1217 between the concentric tubes 1214, 1215, 1216. Heat transfer fluid 1218 passes through the annular gaps 1217. In FIG. 12, three concentric tubes are shown as an example. In this example, the tubes may alternate concentrically between p-type and n-type. Alternatively, the concentric tubes may each be of the same conductivity type, with the counter-type thermoelectric elements formed of another set of concentric tubes of the opposite type of thermoelectric material. The number of concentric tubes can be any practical number. Furthermore, the heat transfer fluid 1218 can also be directed along the outside diameter of the largest tube. Again, the tubes 1214, 1215, and 1216 are designed to be close to thermal equilibrium with the fluid 1218 along any line 1219 parallel to and between the substrates 1202 and 1203.

Figure 13:
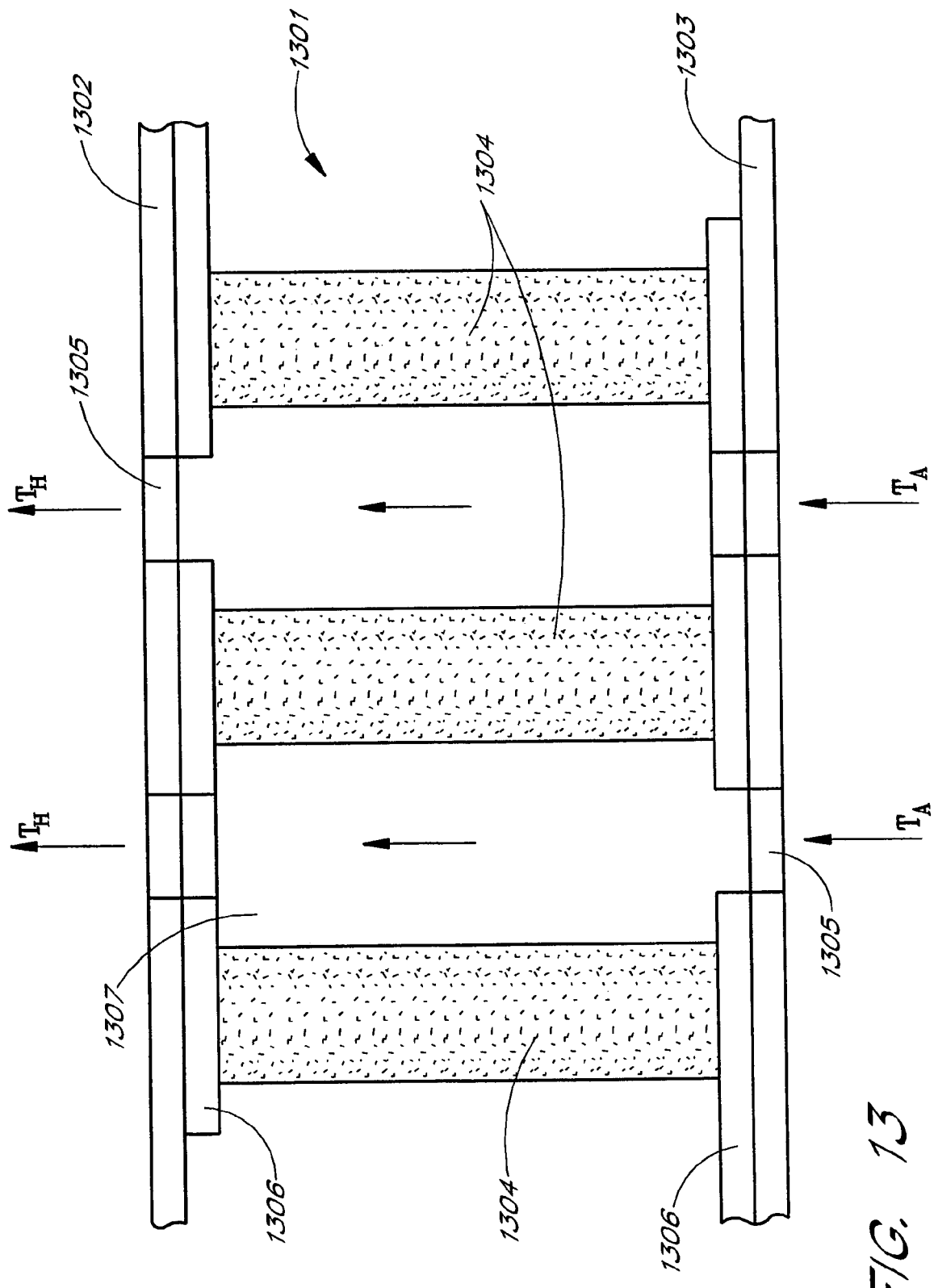
FIG. 13 depicts a detailed illustration of a portion of the TE element array showing convection along the length of the TE elements.

FIG. 13 shows a TE array 1301 constructed with a plurality of solid TE elements 1304 around which heat transfer fluid 1307 flows. The TE array 1301 is constructed like those described above having hot and cool side substrates 1302 and 1303, circuitry 1306 and holes 1305 in the circuitry and substrates to allow the heat transfer fluid (convective medium) 1307 to flow through the array.

Figure 14A:
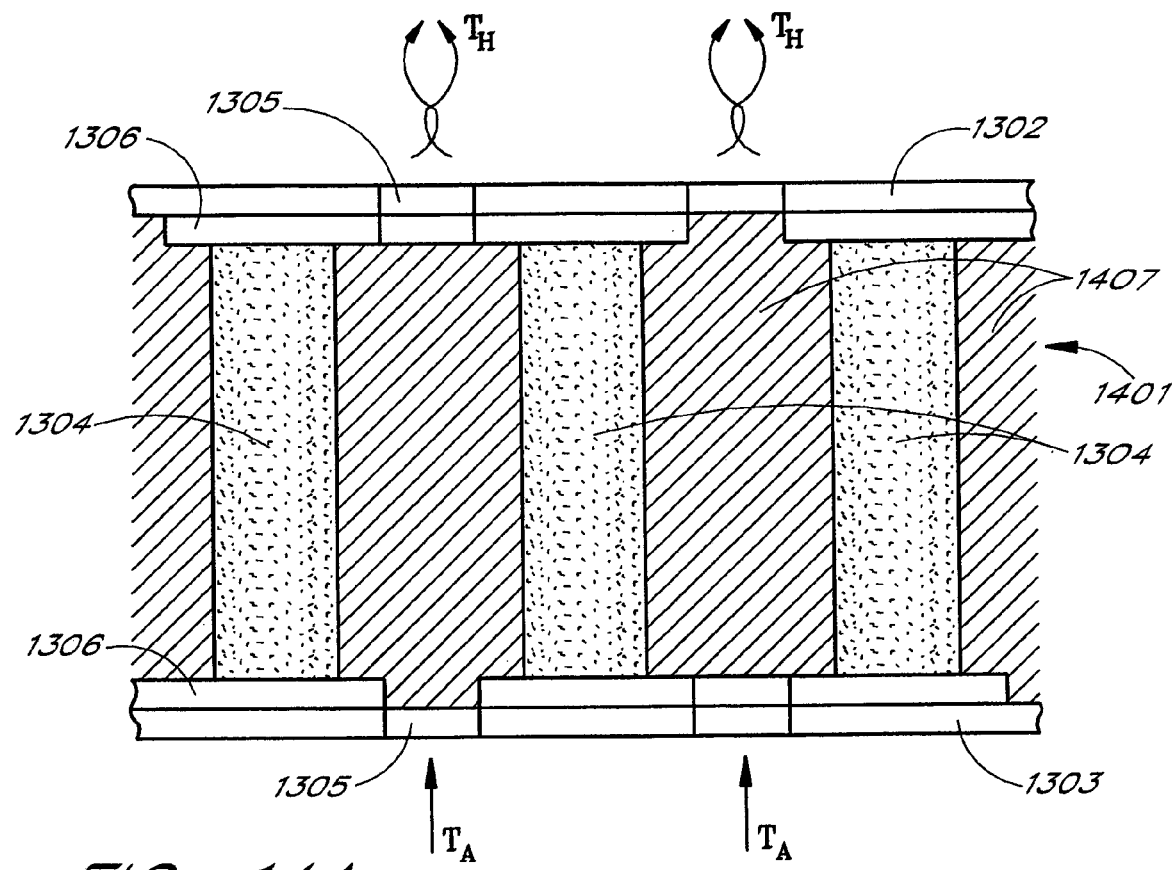
FIGS. 14A and 14B depict a detailed illustration of a portion of the TE element array showing convection along the length of the TE elements with additional mixing created by a heat transfer feature.
Figure 14B:
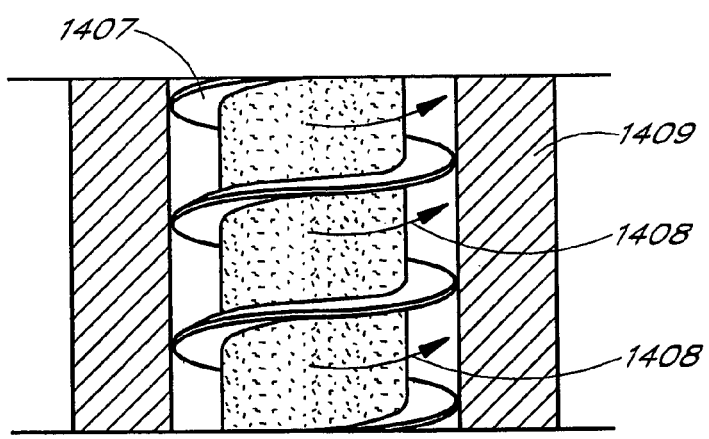

FIGS. 14A and 14B show a portion of a TE array 1401 constructed like that of FIG. 13 with the addition of a heat transfer feature. In this embodiment, the heat transfer feature is between the TE elements 1304. In this Figure, the heat transfer feature is a flow-disturbing feature, such as vanes 1407. One example is depicted in FIG. 14B. The vanes 1407 serve to duct the heat transfer fluid 1408 in a spiral path thereby increasing the heat transfer. Thermal insulation 1409 can be placed around the space that encloses vanes 1407 to further duct the fluid 1408 and enhance heat transfer. As with FIG. 11, other features that improve heat transfer between the thermoelectric elements and the convective medium are possible.

Figure 15A:
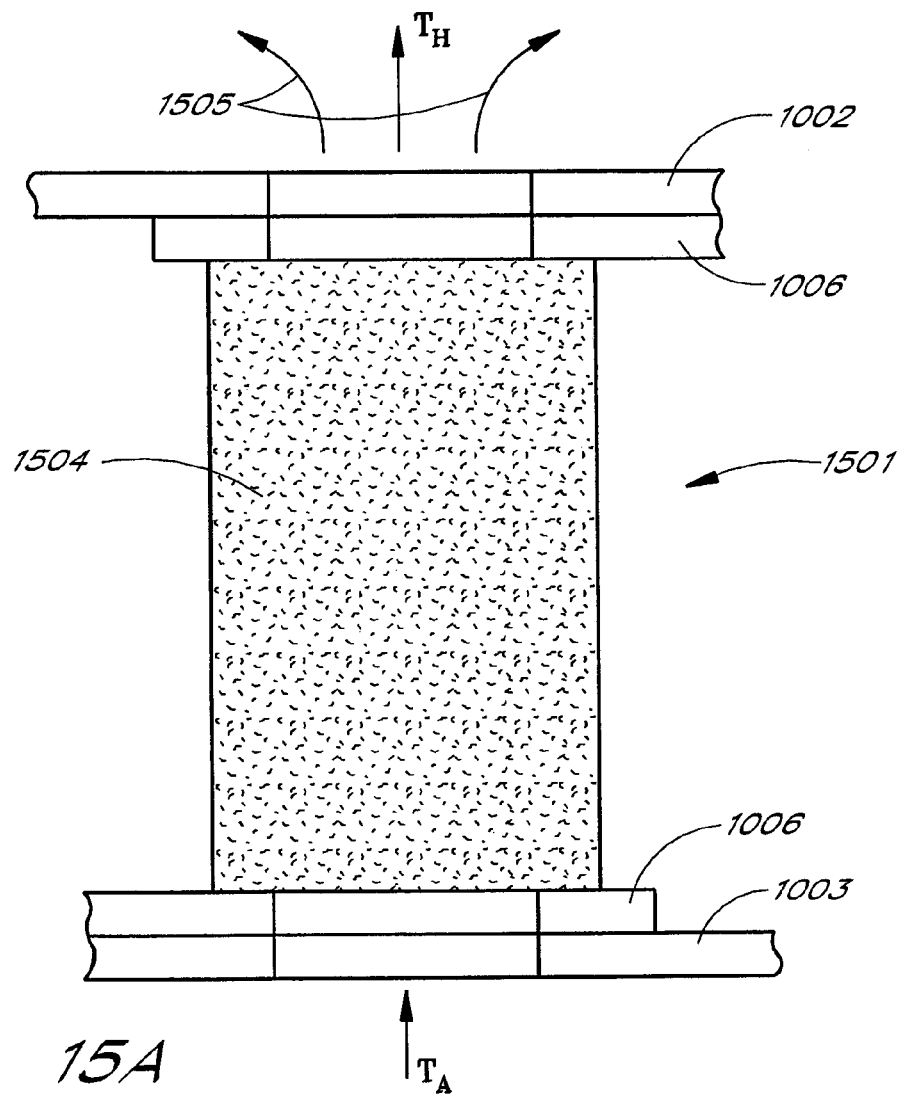
FIGS. 15A and 15B depict a detailed illustration of a portion of the TE element array showing a TE element with a honeycomb structure.
Figure 15B:
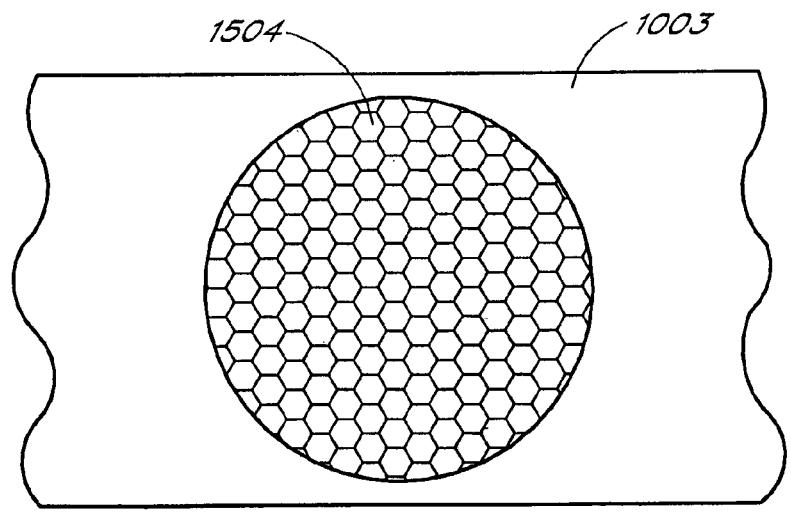

FIG. 15 shows a portion of a TE array 1501 constructed similar to that of FIG. 10 with hot and cold side substrates 1002 and 1003, circuitry 1006 but with the TE elements 1504 allowing fluid to move through them by constructing them with a honeycomb configuration as depicted in FIG. 15B. The large surface area of the honeycomb increases the heat transfer to the heat transfer fluid 1505.

In the embodiments described above in which the heat exchanger is described, fins and finned tubes have been used as examples. Many other heat exchanger designs can be used, such as those described in Kays, William M., and London, A. L., *Compact Heat Exchangers*, McGraw-Hill, 1984.

Figure 16A:
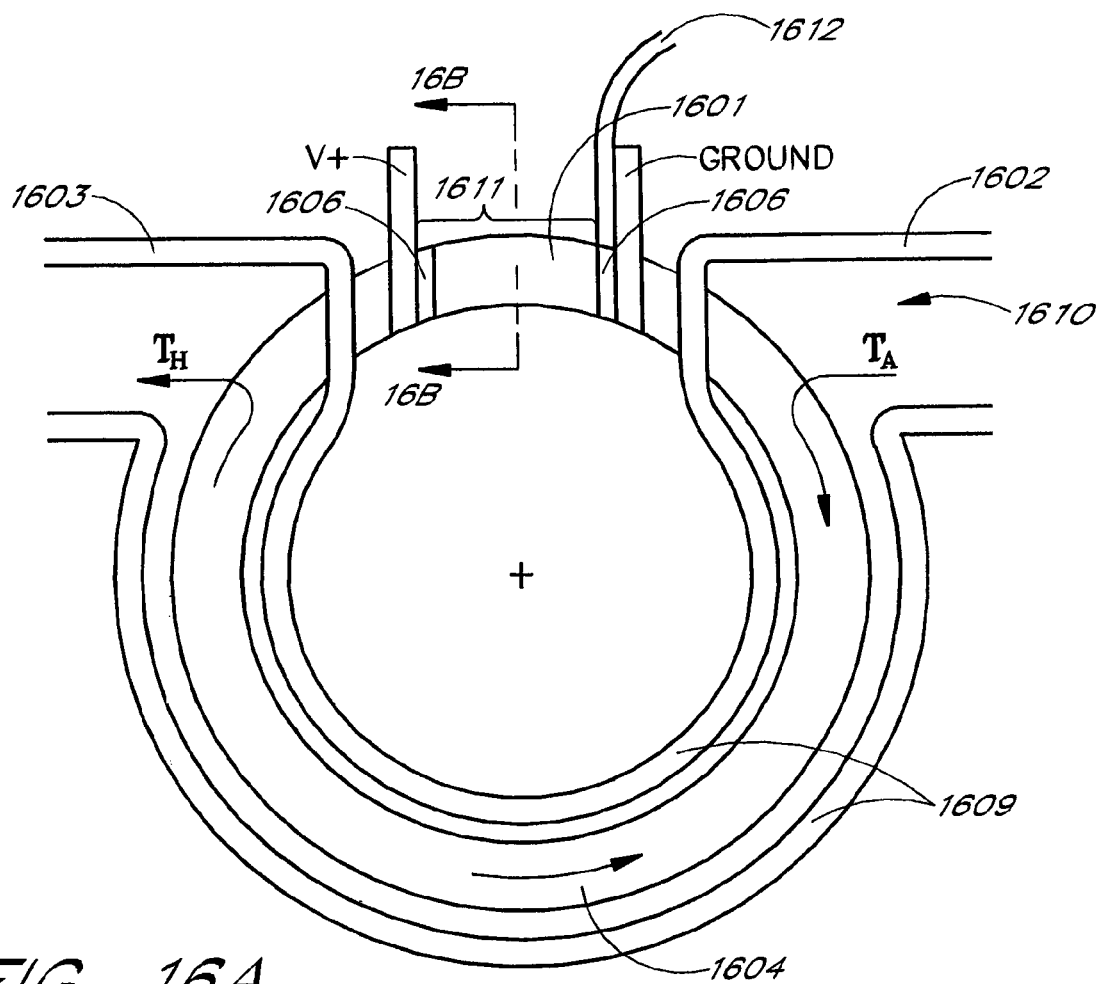
FIGS. 16A and 16B depict another embodiment of a thermoelectric system in accordance with the present invention using a solid material as the convective heat transfer medium.
Figure 16B:
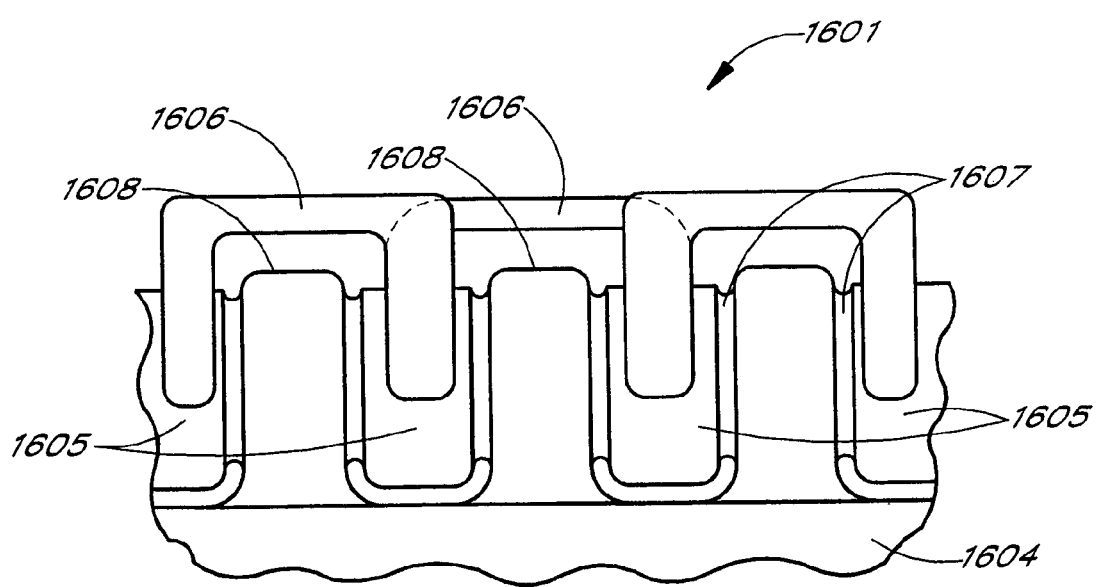

In the embodiment described in FIG. 9, the heat transfer fluid is liquid TE material while in the other embodiments, the heat transfer fluid is some other fluid such as air or water, or a slurry of TE materials and suitable media. Furthermore, a solid heat transfer material can also be employed. FIGS. 16A and 16B show one embodiment using a solid heat transfer material. FIG. 16A shows a plan view of the apparatus. FIG. 16B is sectional view from 16B-16B of FIG. 16A. A TE array 1601 is constructed with TE elements 1605 that are connected in series with circuitry 1606. Voltage, V is applied between the ends of the series circuit. A plurality of TE elements 1605 are arrayed with spaces between them. Filling each space is a heat transfer ring 1604 that has a plurality of circumferential ridges 1608 (like teeth) that fit within the space between the TE elements 1605. The remaining space between the TE elements 1605 and the heat transfer ring's ridges 1608 is filled with a thermally conducting lubricant 1607. The heat transfer ring 1604 is made from a material such as a metal-epoxy composite that has high thermal conductivity axially and radially, and low thermal conductivity circumferentially. As viewed in FIG. 16A, the ring 1604 rotates about its center in a counter-clockwise direction. A duct 1609 with inlet 1602 and outlet 1603 for the fluid to be heated 1610 surrounds that portion of the heat transfer ring 1604 that is not in thermal contact with the TE array 1601. It thereby creates a barrier so that the fluid 1610 is prevented from passing through the TE array region 1611. The fluid 1610 at temperature $T_A$ enters the duct 1609 at inlet 1602 and flows clockwise in FIG. 16A around the heat transfer ring exiting at the outlet 1603 at temperature $T_H$. Thus the ring 1604 and duct 1609 form a reverse flow heat exchanger. As the heat transfer ring 1604 rotates counter-clockwise, it is heated in the region of the TE array 1601. The flow rate of the fluid 1610 and the rotational rate of the heat transfer ring 1604 are such that as the fluid 1610 flows clockwise, heat is transferred from the heat transfer ring 1604 to the fluid 1610 thereby cooling back to a temperature near $T_A$, that portion of the heat transfer ring 1604 that is about to re-enter the TE array 1601. A heat pipe 1612 convects heat from an external heat sink to the cold side of the TE elements 1605.

With the configurations of FIGS. 11-16, it is preferable for efficiency gains that there is little or no temperature difference between the convective medium passing between the thermoelectric elements and the temperature of the thermoelectrics at any location generally perpendicular to the direction of flow. Preferably, the thermal conductivity of the added components in total results in a sufficiently small increase in TE element thermal conductivity so that the loss in performance from these sources is acceptable. This provides for improved system efficiency.

The previous concepts that improve heating can be modified to improve cooling as well. As noted above, while the equation for cooling (21) is similar to that for heating (22), the minus sign in the $I^2R$ term restricts conditions for which improvement occurs and limits its magnitude.

Based on theoretical analysis that parallels that of Goldsmid, the optimum theoretical COP, $\phi_{cm}(\delta)$ can be written as;

$$\phi_{cm}(\delta) = \left(\frac{T_c}{\Delta T}\right)\left(\frac{\sqrt{1+Z(\delta)T(\delta)} - 1 - \xi(\delta)\frac{\Delta T}{T_c}}{\sqrt{1+Z(\delta)T(\delta)} + 1}\right) \quad (26)$$

$$I(\delta)_{opt} = \frac{\alpha T_c}{R}\left(\frac{\sqrt{1+Z(\delta)T_\xi} - 1}{\sqrt{1+Z(\delta)T_\xi} + 1}\right) \quad (27)$$

where;

$$Z(\delta) = \frac{\alpha^2}{RK(\delta)} \quad (28)$$

$$T_\xi = T_c + \frac{\xi(\delta)}{2}\Delta T \quad (29)$$

Similarly, the COP, $\phi_{cc}(\delta)$ for maximum cooling $q_c(\delta)$ can be written as;

$$\phi_{cc} = \frac{Z(\delta)T_C^2 - \Delta T}{Z(\delta)T_C T_H} \quad (30)$$

If, in Equations 26 and 30, $\delta$ goes to zero the results become Equations 9 and 10, so the difference is due to $\delta$, as expected.

As noted above, $\delta$ is restricted by the condition that the cooling power $q_c$, must equal or be greater than $CpM\Delta T_c$, the cooling power required by the fluid flow. This allows efficiency gains of up to about 50% in most circumstances of practical importance, when compared to traditional designs. The configurations for cooling can be similar to that for heating versions depicted in FIGS. 8B through 15. Note that the electrons flow in the opposite direction to that of heating, or the thermal power is extracted from the opposite (cold) side.

Generally, the TE system generates both cold and hot side thermal power. In heating, the cold side waste power must be dealt with, and in cooling the hot waste power must be handled. For example, in Amerigon Incorporated's climate control seat (CCS) system, air from a fan is split so that a fraction, m goes to the side which cools or heats the occupant of the seat and the balance, 1-m, is ducted away way from the seat and occupant.

Figure 1A:
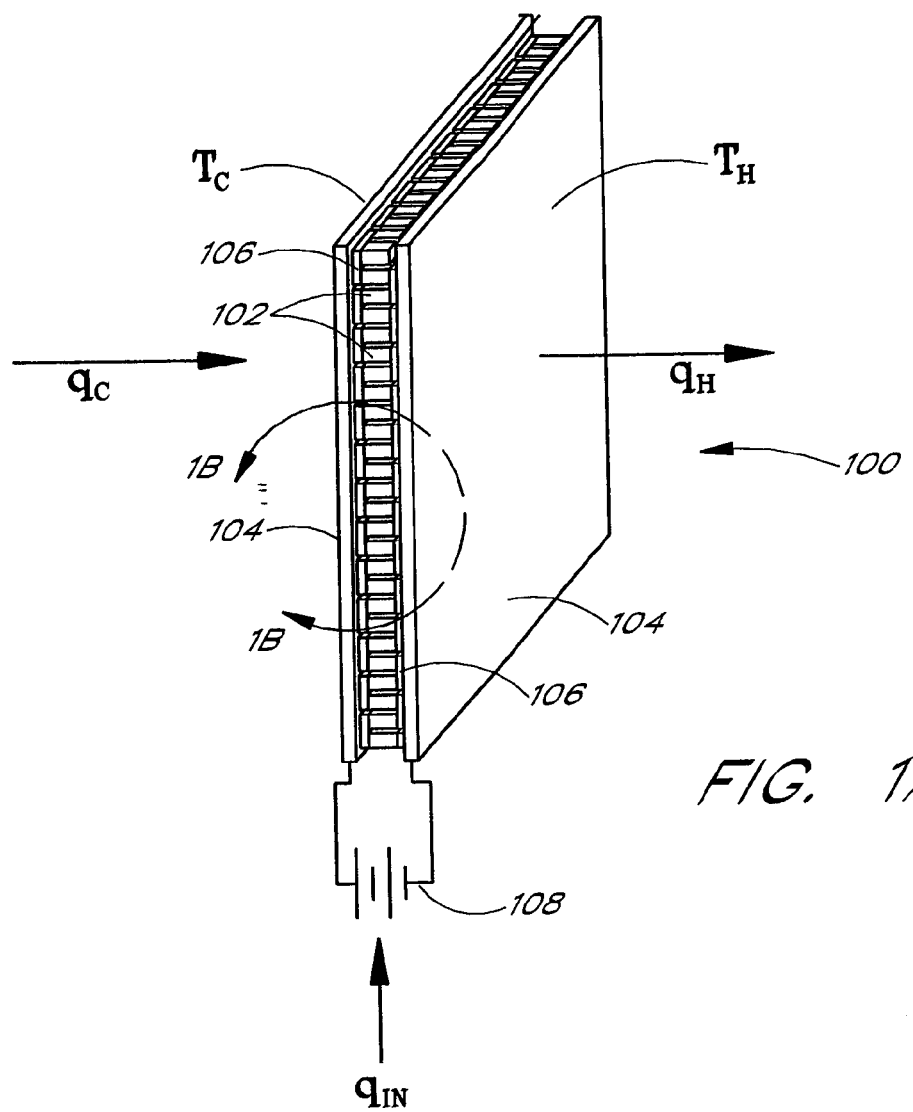
FIGS. 1A and 1B depict a conventional thermoelectric device.
Figure 1B:
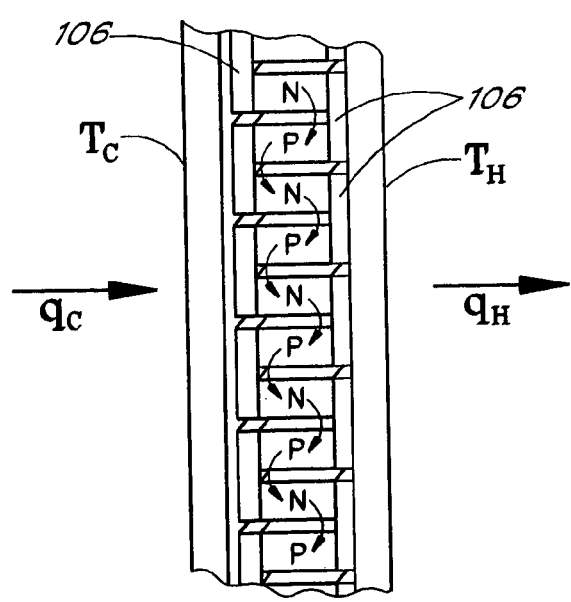
Figure 2:
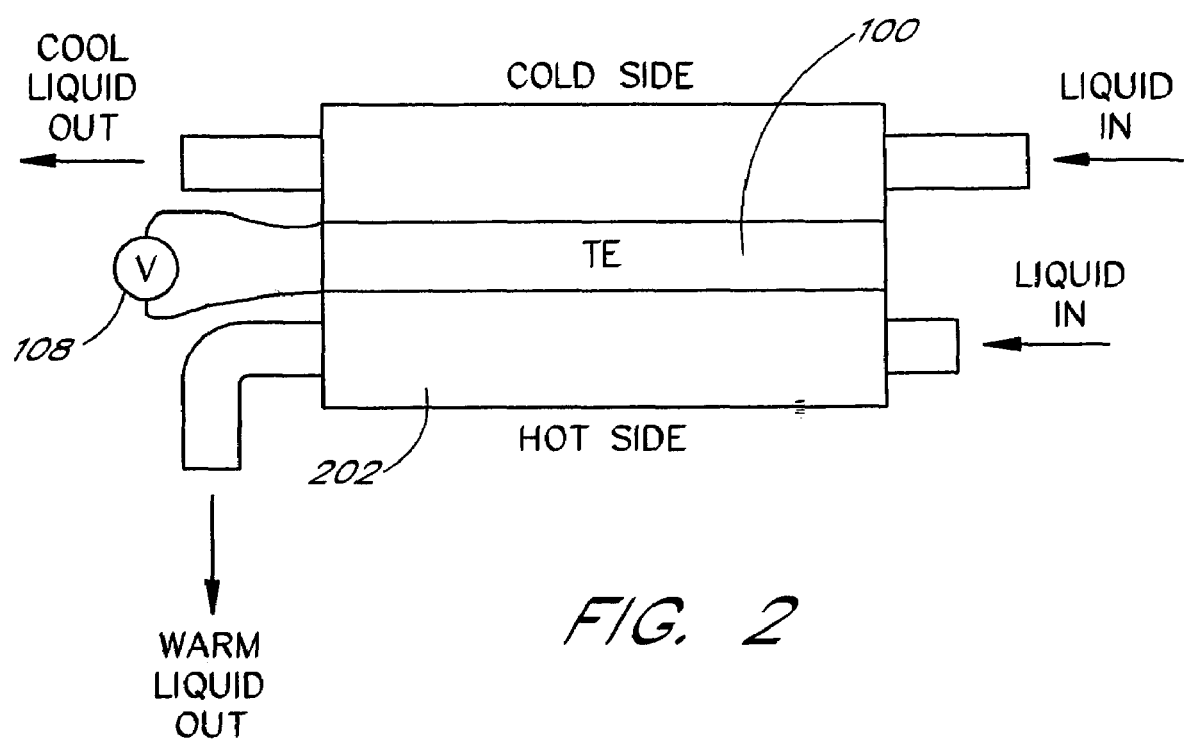
FIG. 2 depicts a conventional thermoelectric device in a conventional fluid heating or cooling application.
Figure 3:
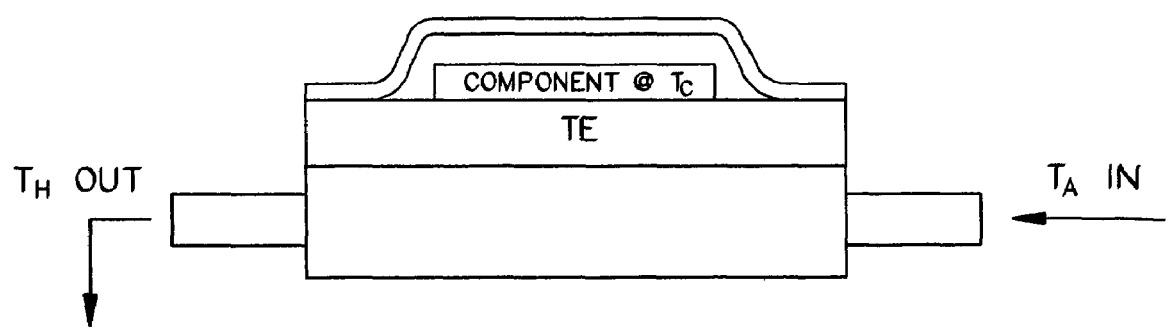
FIG. 3 depicts a conventional thermoelectric element for use in cooling a material or component.
Figure 4:
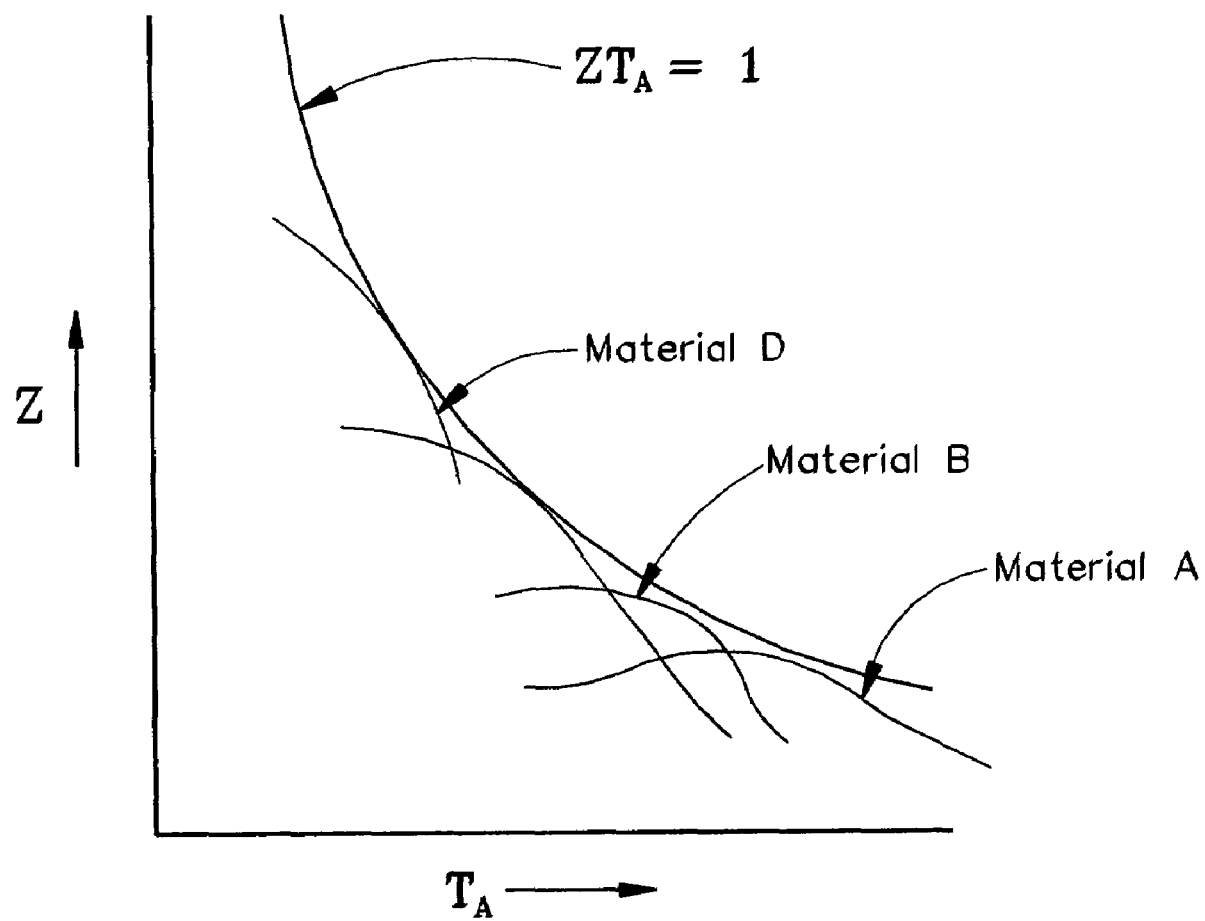
FIG. 4 depicts an efficiency measure of various thermoelectric materials.
Figure 5:
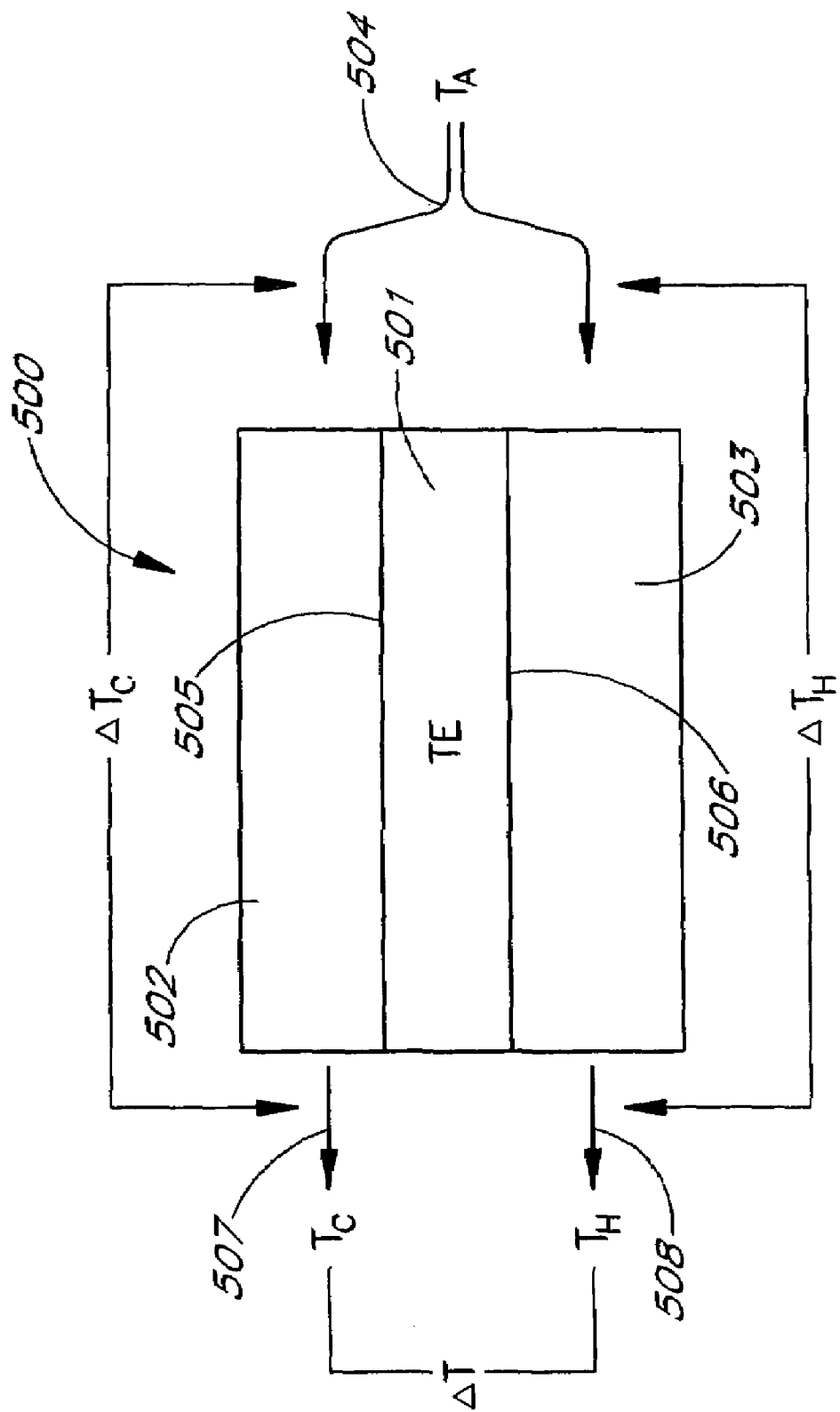
FIG. 5 illustrates a generalized conditions diagram of conventional thermoelectric devices.
Figure 17:
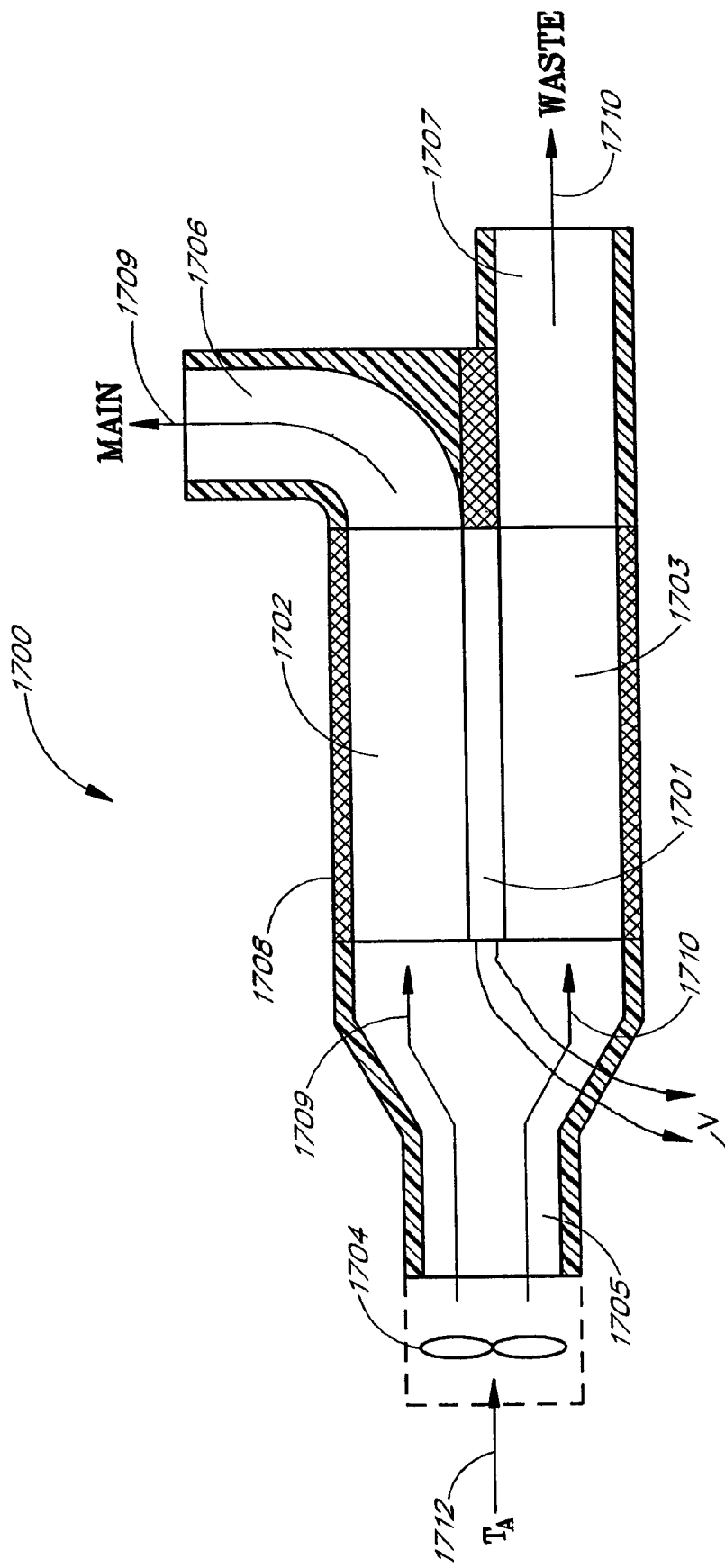
FIG. 17 depicts an existing device used to both heat and cool that can be improved in its efficiency by convective heat transfer in accordance with the present invention.

Such a CCS TE system 1700 is shown in FIG. 17. Herein the air 1709 that is cooled (or heated) and supplied to the occupant is identified as the main side and the air 1710 that contains the thermal power to be ducted away is the waste side. In this design, a TE assembly 1701 similar to that shown in FIG. 1 is in good thermal contact with main side copper fins 1702 and waste side copper fins 1703. Voltage V 1711 is applied to the TE assembly 1701. The polarity of the voltage 1711 determines whether the main side is cooled or heated. A fan 1704 forces air 1712 at ambient temperature $T_A$ into the inlet duct 1705. The geometry of the TE system 1700 divides the total flow to pass a fraction of it through the main side fins 1702 to the main exit duct 1706 and a somewhat larger fraction through the waste side fins 1703 to the waste exit duct 1707. When operating in the cooling mode, the main side air 1709 is cooled and the waste side air 1710 is heated. The housing 1708 is constructed so as to minimize both thermal losses to the environment and heat transfer between the main and waste sides.

Figure 18:
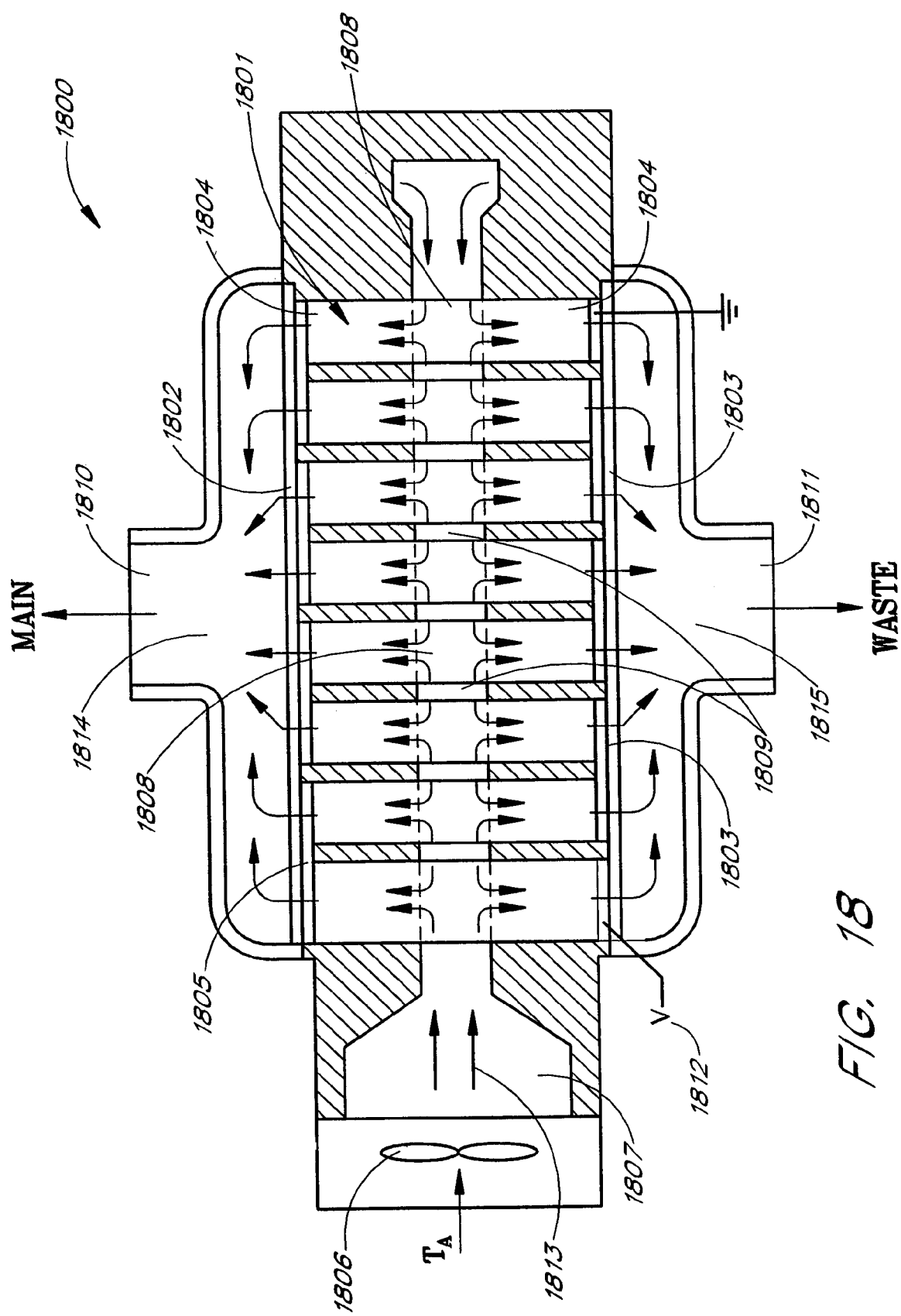
FIG. 18 depicts an embodiment with convective heat transfer of an improvement of the device of FIG. 17 in accordance with the present invention.

The efficiency and ΔT of the TE system 1700 depicted in FIG. 17 increases by using convective heat transport in accordance with the present invention for example as shown by TE system 1800 in FIG. 18. In FIG. 18, a TE assembly 1801 is constructed with a main side substrate 1802 and a waste side substrate 1803 sandwiching a plurality of elongated TE elements 1804. TE elements may be porous, or have other configurations described above which permits fluid to flow through the TE element. Other configurations shown above may also be applicable with slight variations. The TE elements 1804 are connected by circuitry 1805. Voltage V 1812 is applied to the TE assembly 1801. The polarity of the voltage 1812 determines whether the main side is cooled or heated. A fan 1806 forces air 1813 at ambient temperature $T_A$ into the inlet 1807. The air from the inlet 1807 is introduced circumferentially to the TE array 1801 near the centers 1808 of the porous TE elements 1804, a point on the TE elements 1804 that is near ambient temperature $T_A$. A portion of the air 1814 is ducted by a manifold and air passage 1809 through space between the TE elements 1804 and is collected and exits at the main side outlet 1810 and the remaining portion of the air 1815 is ducted to the waste side outlet 1811. COP and mass flow fraction on the main side can be 30-70% larger than with the traditional design.

The embodiment of FIG. 18 could also provide for flow from a point at about ambient temperature between the colder side and the hotter side along the outside of the thermoelectric elements rather than or in addition to flow through the thermoelectric elements. In other words, a convective medium may flow from a point between the hotter side and the colder side along the thermoelectric elements toward both the hotter side and the cooler side. Similarly, in the embodiment of FIG. 18, with the convective material entering from between the hotter side and the colder side, flow could be toward one or the other sides.

Figure 19:
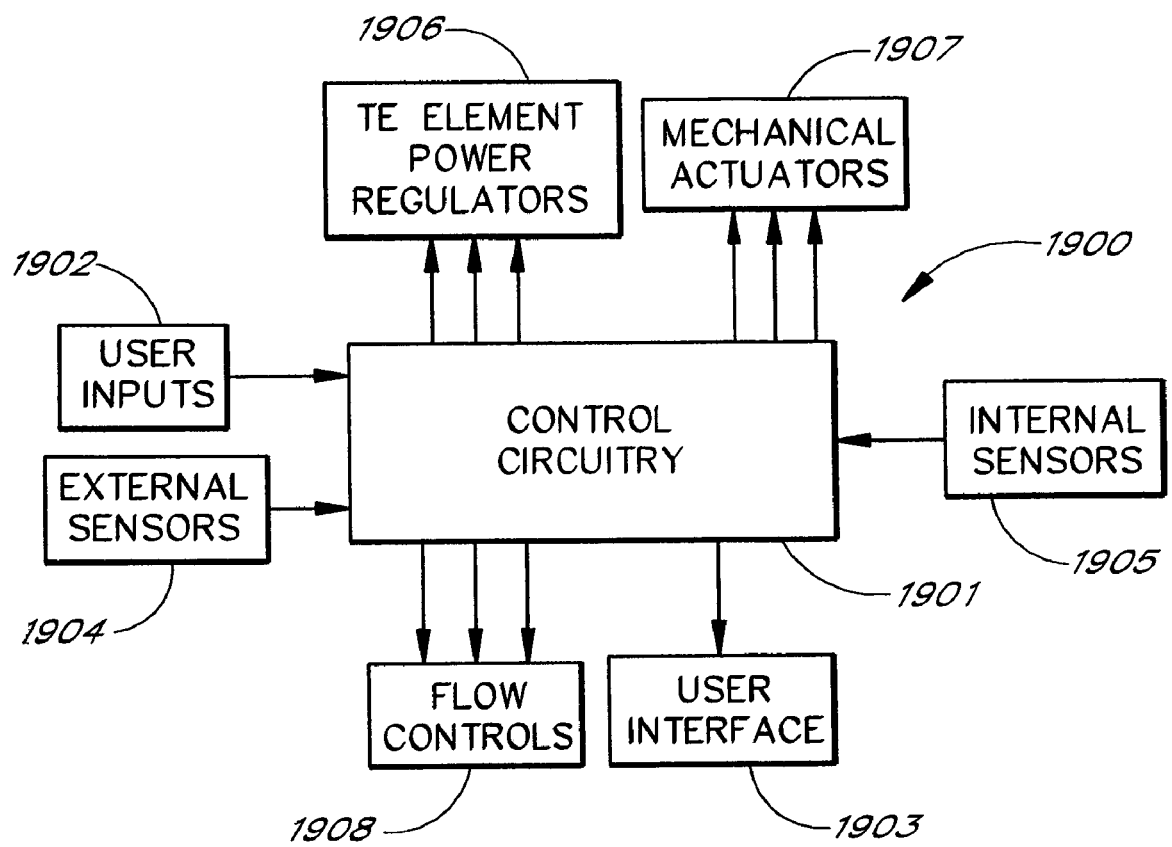
FIG. 19 illustrates a control system for use with thermoelectric systems of the present invention.

The embodiments described above as examples may be connected to a control system for the purpose of adjusting system performance based on, for example, user inputs, external conditions, or conditions within the system itself. These conditions, some or all of which may be present, include external temperatures or flows, internal temperatures or flows, and user selectable inputs to manually achieve predetermined or dynamically determined performance of the system. FIG. 19 depicts, as a block diagram, one example of such a control system 1900.

The control system has a control circuit 1901 coupled to user selectable inputs 1902, a user interface 1903, external sensors 1904, internal sensors 1905, TE element power regulators 1906, actuators 1907 and flow controls 1908. Any one or more of the items connected to the control circuit 1901 may be provided or not provided in any given design. Generally, the control circuit 1901 is an electronic circuit that can be as simple as a wiring harness or as complex as a programmable micro-controller circuit with many inputs and outputs. Virtually any manual input device may be connected; for example these inputs can be simple on/off switches, multi-position switches, potentiometers, keyboards or other user selectable devices. A user interface 1903 employing for example, a display, indicator lights, or audible prompts can be provided for the user selectable or configurable inputs.

External conditions are sensed by external sensors 1904. These sensors are, for example, sensors of ambient conditions, or inlet or outlet fluid temperatures. Internal conditions are sensed by sensors and include, for example, TE currents, TE voltages, fluid flow rates, or internal fluid temperatures.

Advantageously, through the user interface 1903, the conditions monitored or actuation levels for the conditions monitored via the sensors 1902 and 1904 can be modified to customize the TE system for its particular application or the particular condition to which it is subjected at any given time. The sensors 1902, 1904, and 1905 are monitored by control circuitry 1901 which, using hardware or software relationships (whose nature depends upon the application), causes adjustments to be made to the system in accordance with the sensor inputs. When system complexity warrants it, an algorithm may be employed within the control circuitry or its software.

The control circuitry 1901 can provide electrical outputs to a variety of devices that can adjust for example, power to the TE elements, resistance of TE elements, or flow of fluids. Power to the TE elements may be varied for all TE elements at once, or individually. For example, voltage or current regulators 1906 may be utilized. TE resistances may be adjusted by means of mechanical actuators 1907. Flow rates may be adjusted by means of for example, vanes, valves, pump speeds, or fan speeds 1908. It should be noted that the control system may also be as simple as a user adjusting a switch or thermostat in response to a temperature sensed by the user.

An advantage of this type of system is that it permits the thermal power generated by the TE system to be varied as desired to achieve improvement in efficiency or power output by taking into account not only expected user preferences and conditions, but also the changes in them that occur from time to time. The devices used to accomplish the sensory inputs, the user interface, the flow controls and the power regulation can be via commercially available devices, straightforward customization of such devices, or special custom components.

Examples of ways to adjust the resistances of liquid or slurried TE elements are depicted in FIGS. 20A through 20D. These examples may be used in the construction of the embodiment described above in FIG. 9. Advantages of changing the resistance are described in co-pending patent application Ser. No. 09/844,818, file on Apr. 27, 2001 entitled Improved Efficiency Thermoelectrics Utilizing Thermal Isolation, by the same inventor, which is incorporated by reference herein.

Figure 20A:
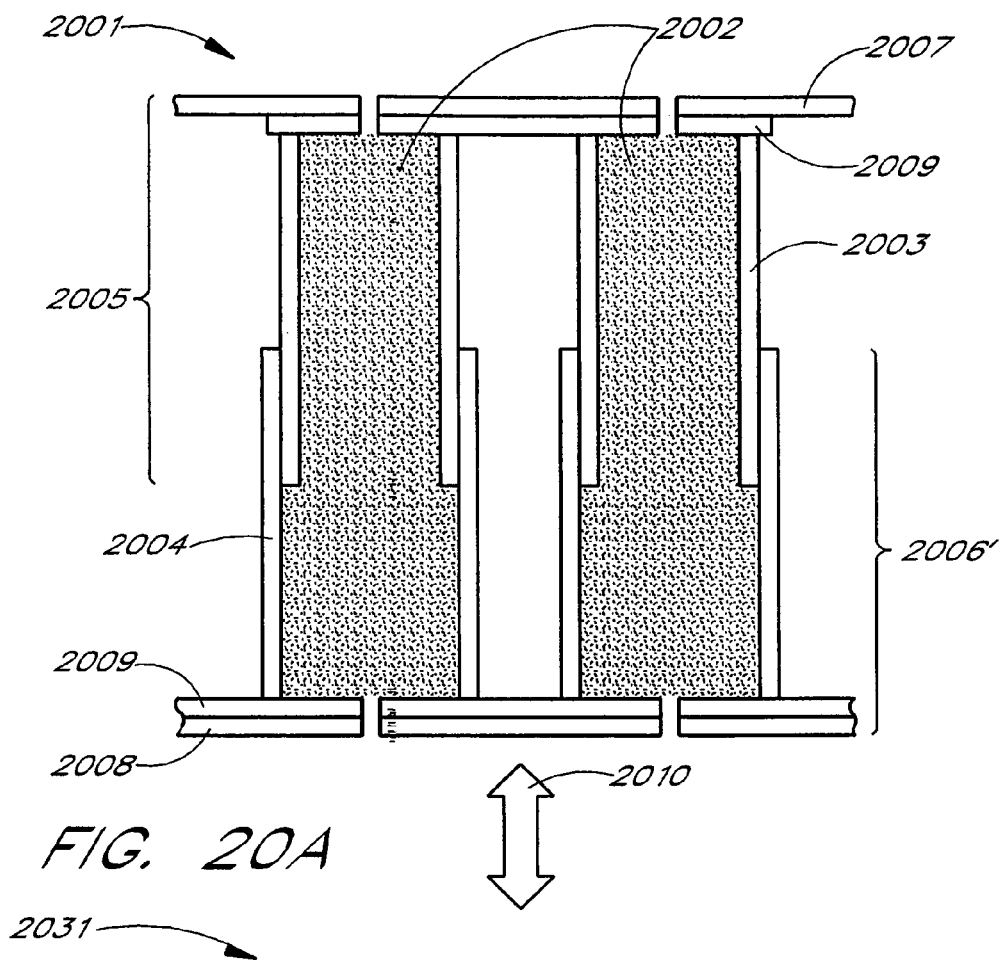
FIGS. 20A-20D illustrate several variations of thermoelectric elements configured in a manner to vary their thermal and electrical characteristics.

FIG. 20A shows a portion of a TE element array 2001 in which the resistance of the TE elements 2002 is changed by adjusting their active lengths. In this example, telescoping sleeves 2003 and 2004 are utilized. The upper portion 2005 has an upper substrate 2007, circuitry 2009 to electrically connect the TE elements, and the upper sleeve 2003. The lower portion 2006 has the lower substrate 2008, circuitry 2009, and the lower sleeve 2004. The TE elements 2002 are liquid or slurried TE material that is confined within the low thermal conductivity, electrically insulative upper sleeve 2003 and lower sleeve 2004. A seal is formed between the outer surface of the upper sleeve 2003 and the inner surface of the lower sleeve 2004. An actuator 2010 (represented by the arrow) moves the lower portion 2006 toward (decreasing TE element lengths and therefore resistance) or away from the upper portion 2005 that is stationary in this example.

Figure 20B:
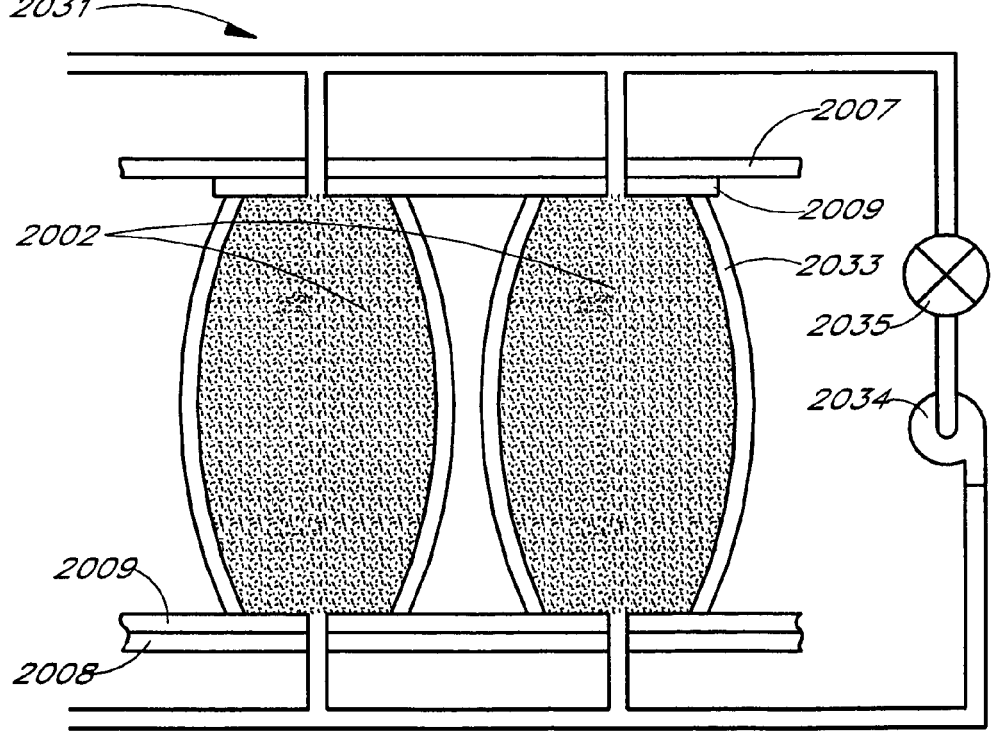

FIG. 20B shows a portion of a TE element array 2031 constructed with substrates 2007 and 2008, liquid or slurried TE material 2002, circuitry 2009, a pump 2034, and a pressure control valve 2035. In FIG. 20B, the telescoping sleeves (of the device in FIG. 20A) are replaced with elastomeric tubes 2033 that are deformed under the action of the pump 2034 and the pressure control valve 2035. As the pressure is adjusted upward the sleeves 2033 bulge, thereby increasing the cross-sectional area of the TE elements 2002 thus decreasing their electrical resistance. This in turn can change the efficiency, thermal power transfer, and fluid flow in the TE system 2031.

Figure 20C:
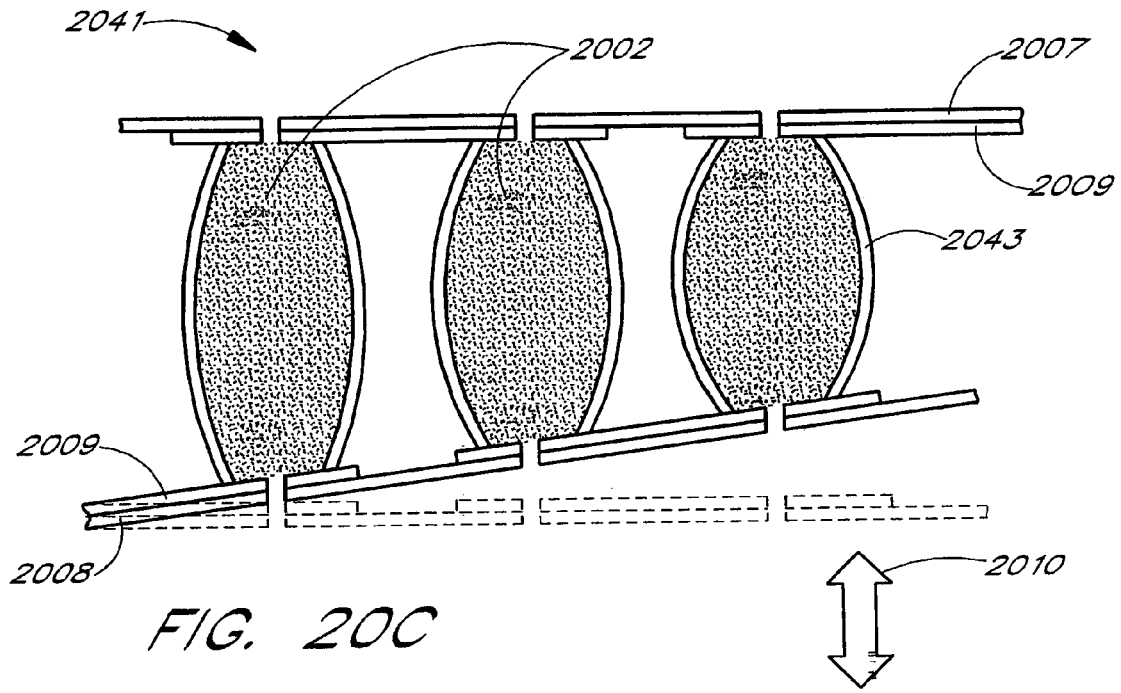

FIG. 20C shows a portion of a TE element array 2041 with a composite, flexible sleeve 2043 that deforms outward from the tube interior when subjected to an axial, compressive deflection load applied by actuator 2010. In FIG. 20C, only one end of the lower substrate 2008 and its circuitry 2009 moves so as to change the length and cross-sectional area of the rightmost TE elements 2002 more than those at the left. This changes the resistance of all but the leftmost element and does so in an approximately linear fashion.

Figure 20D:
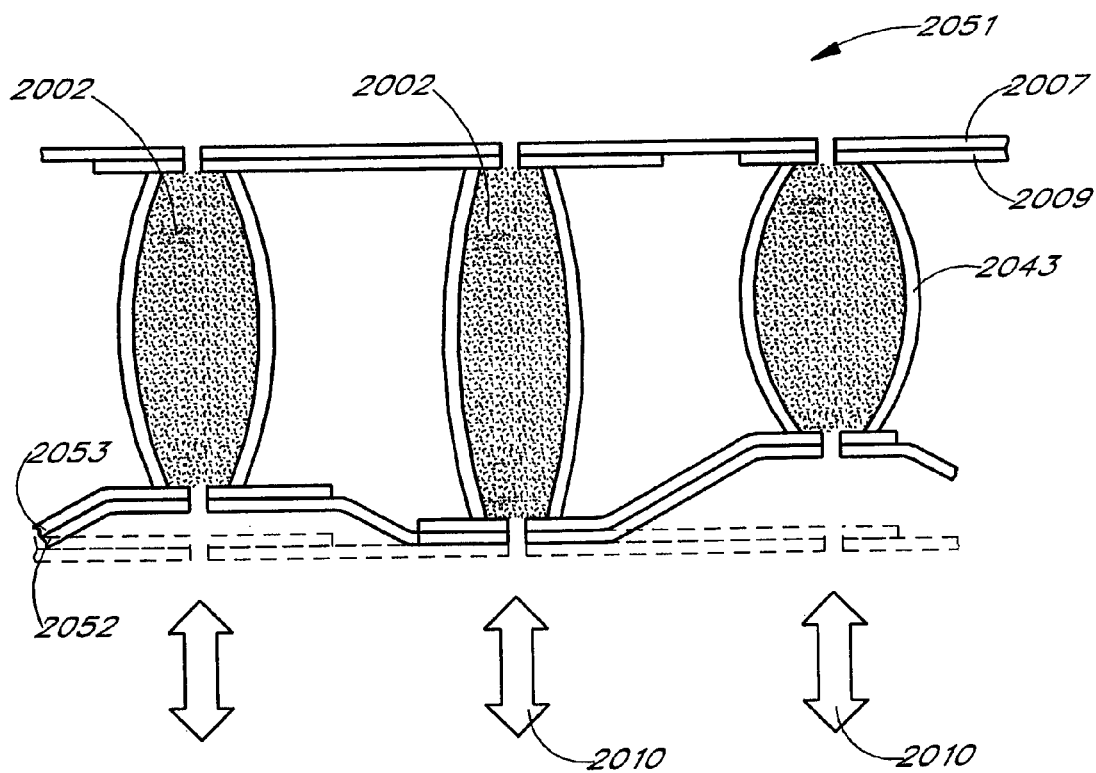

FIG. 20D shows a portion of a TE element array 2051 constructed like that of FIG. 20C but which has a flexible substrate 2052, flexible lower circuitry 2053, and a plurality of actuators 2010. The actuators 2010 adjust the lengths of sectional areas of TE elements 2002 or of sections of TE elements either individually or as groups.

Many other designs that employ convection are possible. The goal is to have the material to be cooled and/or heated able to convect efficiently the thermal power generated to enhance the operation of that side. Generally, to increase efficiency, the ratio of convection to conduction, δ, should be as large as is allowed by the available thermal power produced. Current and TE geometry are adjusted to meet design needs of both initial cost and operating costs. Solids, liquids and gasses can be used alone, or in combination to transport the thermal power.

The concepts and designs that were discussed in the context of heating apply to cooling as well. In many designs the same device can be used in both the cooling and heating mode with very little, if any, physical change to the system. For example, the modified CCS system presented in FIG. 18 could be used in both heating and cooling mode by adjusting current flow and direction and varying fan speed.

To optimize overall performance operation in both cooling and heating, design tradeoffs are made and it is advantageous to allow material movement or fluid rates to vary, along with current, and independently, with the proportions of flow to the cold and hot sides.

It should be noted that the N-and P-type TE elements are made up of TE materials that have been drawn equal in size and shape. However, they need not be equal in size and shape to achieve optimum efficiency. The preferred requirement for efficient functionality is that;

$$\frac{L_n A_p}{L_p A_n} = \left(\frac{\rho_p \lambda_n}{\rho_n \lambda_p}\right) \tag{31}$$

where;
L=TE element length
A=TE element cross sectional area
ρ=material electrical resistivity
λ=material thermal conductivity For optimum efficiency, Equation 31 should be satisfied, and the geometry should deliver the required thermal power. The shape of the P and N elements can differ to achieve other design purposes. For example, only the P element could be liquid and convect thermal power, or alternately, only the N elements could be porous. Generally, system efficiency is compromised if not all elements use convection but efficiency gains over conventional systems would still be obtained. Considerations such as cost, material availability, etc. would dictate appropriate design choices and final configuration.

Where the TE material itself moves and thereby transports its thermal power, the thermal differences (thermal lags) that arise when thermal power transfers from one part to another are eliminated. Such lags tend to reduce efficiency unless there is a corresponding gain to some other part of the system.

As mentioned above, several different embodiments and configurations in accordance with the present invention have been described above. The embodiments are intended to be exemplary rather than restrictive. Variations and combinations of the above embodiments may be made without departing from the invention. Accordingly, the invention is defined by the following claims and their equivalents.

What is claimed is:

1. A thermoelectric system comprising:
at least one thermoelectric element comprising at least one first side and at least one second side, the at least one first side and the at least one second side having a temperature gradient between them during operation, wherein the at least one thermoelectric element permits flow of at least one convective medium through the at least one thermoelectric element to provide generally steady-state convective heat transport toward at least one side of the at least one thermoelectric element, wherein the at least one convective medium flows generally from the at least one second side to the at least one first side.

2. A thermoelectric system comprising:
at least one thermoelectric element comprising at least one first side and at least one second side, the at least one first side and the at least one second side having a temperature gradient between them during operation, wherein the at least one thermoelectric element permits flow of at least one convective medium through the at least one thermoelectric element to provide generally steady-state convective heat transport toward at least one side of the at least one thermoelectric element, wherein the at least one convective medium flows through the at least one thermoelectric element.

3. The thermoelectric system of claim 1, wherein the at least one convective medium flows along the at least one thermoelectric element.

4. The thermoelectric system of claim 3, further comprising at least one additional thermoelectric element.

5. The thermoelectric system of claim 4, wherein the at least two thermoelectric elements form concentric tubes with the convective medium flow between the concentric tubes.

6. A thermoelectric system comprising:
at least one thermoelectric element comprising at least one first side and at least one second side, the at least one first side and the at least one second side having a temperature gradient between them during operation, wherein the at least one thermoelectric element permits flow of at least one convective medium through the at least one thermoelectric element to provide generally steady-state convective heat transport toward at least one side of the thermoelectric element, wherein at least part of the convective medium is a thermoelectric material, said convective medium thermoelectric material also forming at least a portion of the at least one thermoelectric element.

7. The thermoelectric system of claim 6, wherein said convective medium thermoelectric material forms at least a portion of the thermoelectric element, and a solid thermoelectric material forms a second portion of the at least one thermoelectric element.

8. The thermoelectric system of claim 1, wherein at least part of the convective medium is a fluid.

9. The thermoelectric system of claim 1, wherein at least part of the convective medium is a solid.

10. The thermoelectric system of claim 1, wherein at least part of the convective medium is a mixture of fluid and solid.

11. The thermoelectric system of claim 1, wherein at least a portion of the at least one thermoelectric element comprises at least one heat transfer feature that improves heat transfer between at least some of the at least one convective medium and the at least one thermoelectric element.

12. A method of improving efficiency in a thermoelectric system having at least one thermoelectric element comprising at least one first side and at least one second side, the at least one first side and the at least one second side having a temperature gradient between them during operation, the method comprising actively convecting heat through the at least one thermoelectric element in a generally steady-state manner, wherein actively convecting heat comprises flowing at least one convective medium through the at least one thermoelectric element.

13. A thermoelectric system comprising:
at least one thermoelectric element comprising at least one first side and at least one second side, the at least one first side and the at least one second side having a temperature gradient between them during operation, wherein at least a portion of the thermoelectric element permits flow of at least one convective medium through the at least a portion of the thermoelectric element to provide generally steady-state convection toward at least one side of the thermoelectric element; and
at least one control system, said control system comprising:
at least one controller,
at least one input coupled to at least one controller, and
at least one output coupled to at least one controller and to said thermoelectric element, said output controllable by said controller to modify at least one characteristic of said thermoelectric element.

14. The thermoelectric system of claim 13, wherein the at least one characteristic impacts the convective heat transport, and wherein the control system improves efficiency by modifying the at least one characteristic.

15. The thermoelectric system of claim 13, wherein the control system varies at least a flow current of the at least one convective medium.

16. The thermoelectric system of claim 2, wherein the at least one convective medium flows through the at least one thermoelectric element in at least two general directions.

* * * * *